United States Patent
Suga et al.

(10) Patent No.: US 7,554,350 B2
(45) Date of Patent: Jun. 30, 2009

(54) BURN-IN SYSTEM WITH HEATING BLOCKS ACCOMMODATED IN COOLING BLOCKS

(75) Inventors: Kazunari Suga, Tokyo (JP); Toru Honobe, Tokyo (JP); Seigo Matsunaga, Tokyo (JP); Kazumi Kita, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/116,599

(22) Filed: May 7, 2008

(65) Prior Publication Data

US 2008/0238465 A1    Oct. 2, 2008

Related U.S. Application Data

(62) Division of application No. 11/226,408, filed on Sep. 15, 2005, now Pat. No. 7,397,258.

(51) Int. Cl.
*G01R 31/26*    (2006.01)
(52) U.S. Cl. .................. 324/760; 324/765
(58) Field of Classification Search .......... None
See application file for complete search history.

(56) References Cited

U.S. PATENT DOCUMENTS

| | | | |
|---|---|---|---|
| 5,420,520 A | | 5/1995 | Anschel et al. |
| 5,944,093 A | * | 8/1999 | Viswanath ............ 165/104.26 |
| 6,184,504 B1 | * | 2/2001 | Cardella .................... 219/513 |
| 6,323,665 B1 | | 11/2001 | Johnson et al. |
| 6,636,062 B2 | | 10/2003 | Gaasch et al. |
| 2002/0014894 A1 | | 2/2002 | Yonezawa et al. |

FOREIGN PATENT DOCUMENTS

| | | |
|---|---|---|
| JP | 09-153532 A | 6/1997 |
| JP | 11-145227 A | 5/1999 |
| JP | 2000-284018 A | 10/2000 |
| JP | 2001-264381 A | 6/2001 |
| JP | 2004-79623 A | 3/2004 |

* cited by examiner

*Primary Examiner*—Vinh P Nguyen
(74) *Attorney, Agent, or Firm*—Birch, Stewart, Kolasch & Birch, LLP

(57) ABSTRACT

A burn-in system enabling the temperatures of a large number of electronic devices differing in amount of self generated heat to be simultaneously reliably adjusted to a predetermined temperature, that is, a burn-in system bringing heater blocks having heaters, cooling blocks formed with channels able to carry a coolant, and sensor blocks having temperature sensors into contact with a plurality of DUTs mounted on a burn-in board and simultaneously performing a burn-in test on the plurality of DUTs, wherein each cooling block is formed with a first accommodating space and second accommodating space, each heater block is accommodated in a first accommodating space in a state maintaining clearance from the inside wall surfaces, and each sensor block is accommodated in a second accommodating space in a state maintaining clearance from the inside wall surfaces.

17 Claims, 13 Drawing Sheets

BURN-IN SYSTEM WITH HEATING BLOCKS ACCOMMODATED IN COOLING BLOCKS

This application is a Divisional of application Ser. No. 11/226,408, filed on Sep. 15, 2005, now U.S. Pat. No. 7,397,258, the entire contents of which are hereby incorporated by reference and for which priority is claimed under 35 U.S.C. § 120.

BACKGROUND OF THE INVENTION

1. Field of the Invention

The present invention relates to a burn-in system for conducting a burn-in test for extracting initial defects of semiconductor integrated circuits and other various types of electronic devices, more particularly relates to a burn-in system for simultaneously conducting a burn-in test on a large number of electronic devices. In countries where incorporation by reference of other documents is allowed, the content described in the following application is incorporated into the present application by reference and made part of the description of this application.

Japanese Patent Application No. 2004-079623, filed on Mar. 19, 2004

2. Description of the Related Art

As a burn-in system used for burn-in tests—a type of screening test for extracting initial defects of electronic devices and removing initially malfunctioning devices, there is known a system holding a burn-in board mounting a large number of devices under test in a burn-in chamber, applying a predetermined voltage to impart electrical stress, and heating the air in this burn-in chamber to impart a predetermined temperature of thermal stress or a system not heating the air in the burn-in chamber, but instead providing heater blocks and bringing the heater blocks into direct contact with the devices under test to impart thermal stress for a burn-in test.

In such a burn-in system, since a burn-in test is conducted over a long period of time from several hours to several tens of hours, the test efficiency is raised by conducting the burn-in test simultaneously for a large number of electronic devices. At this time, the test is desirably performed in a state giving as uniform a thermal stress as possible to the large number of devices under test.

However, in actuality, even with the same lot of electronic devices, inherent defects, manufacturing variations, etc. result in each electronic device differing in consumed power, so the electronic devices sometimes vary in amounts of self generated heat as well. Therefore, even if simply heating the air in the burn-in chamber or bringing heater blocks into contact with the devices, it is sometimes difficult to apply a uniform thermal stress to the simultaneously tested plurality of electronic devices.

In particular, recent IC chips have become larger in capacity, higher in performance, and faster in speed. Along with this, the amount of self generated heat has been increasing as a general trend. Along with this, the variation in amount of self generated heat has also become larger as a general trend. Therefore, accurate control of the temperature of each electronic device in a burn-in test is being demanded.

SUMMARY OF THE INVENTION

The present invention has as its object the provision of a burn-in system enabling the temperature of a large number of electronic devices differing in amount of self generated heat to be simultaneously reliably adjusted to a predetermined temperature.

To achieve this object, according to a first aspect of the present invention, there is provided a burn-in system bringing heating blocks having heating means for heating a plurality of devices under test mounted on a burn-in board and cooling blocks formed with channels able to carry a coolant for cooling the devices under test into contact with the devices under test and simultaneously conducting a burn-in test on the plurality of devices under test, wherein each cooling block is formed with a first accommodating space for accommodating the heating block, and each heating block is accommodated in a first accommodating space in a state with a layer of air formed with the cooling block so as to be insulated from the cooling block.

In the present invention, there is provided a burn-in system adjusting the temperatures of a plurality of devices under test mounting on a burn-in board by heating blocks and cooling blocks and simultaneously performing a burn-in test of those devices under test, wherein each cooling block is formed with a first accommodating space and accommodates the heating block in that first accommodating space in a state maintaining clearance.

Due to this, a layer of air is formed between each cooling device for cooling a device under test and the heating block for heating that device under test, the heating block is insulated from the cooling block, and the heating block is made thermally floating in state with respect to the cooling block, so heat is not directly conducted from the heating block to the cooling block. For this reason, the heating means of each heating block can positively and easily raise the temperature of the individual electronic device and coolant flowing through the channels formed in each cooling block can be used to positively and easily cool the individual electronic device, so when simultaneously performing a burn-in test on a plurality of electronic devices, it is possible to independently and accurately control the temperatures of the individual electronic devices.

While not particularly limited in the present invention, preferably each heating block is supported with play with respect to the cooling block, and when a heating block is not in contact with a device under test, a front end face of the heating block sticks out relative to a front end face of the cooling block.

By making the front end face of the heating block stick out from the front end face of the cooling block, when contacting a device under test, the heating block contacts the device under test before the cooling block. Further, as explained above, each heating block is supported with play with respect to the cooling block in a state maintaining clearance between the heating block and the inside wall surfaces of the first accommodating space, that is, the heating block is in a mechanically floating state with respect to the cooling block, so the heating block contacting the device under test before the cooling block operates fit against that device under test. Due to this, since the front end face of the heating block is in close contact with the device under test, the device under test can be efficiently raised in temperature.

While not particularly limited in the present invention, preferably each heating block and cooling block have provided between them first biasing means for biasing the heating block to a front end side.

By providing first biasing means between each heating block and cooling block, when the heating block contacts a device under test, that heating block is suitably pushed against and closely contacts the device under test, so the device under test can be raised in temperature more efficiently.

While not particularly limited in the present invention, preferably when a heating block is not in contact with the device under test, the first biasing means cause the heating block to be biased to a contact surface side and cause part of the heating block to contact the cooling block.

Due to this, the heat of the heating means of the heating block can be utilized to raise the temperature of the coolant flowing through the channels of the cooling block, so there is no longer a need to separately provide a heater for heating the coolant separate from that heating means.

While not particularly limited in the present invention, preferably the system is further provided with measurement blocks having measuring means for measuring temperatures of the devices under test, each cooling block is formed with a second accommodating space for accommodating the measurement block, and each measurement block is accommodated in the second accommodating space in the state with a layer of air formed with the cooling block so as to be insulated from the cooling block.

Due to this, a layer of air is formed between each cooling block for cooling a device under test and the measurement block for measuring the temperature of the device under test, the measurement block is insulated from the cooling block, and the measurement block is made thermally floating in state with respect to the cooling block, so the temperature of the device under test can be accurately measured and the precision of temperature adjustment is improved.

To achieve the object, according to a second aspect of the invention, there is provided a burn-in system bringing cooling blocks formed with channels able to carry a coolant for cooling a plurality of devices under test mounted on a burn-in board and measurement blocks having measuring means for measuring the temperatures of the devices under test into contact with the plurality of devices under test and simultaneously conducting a burn-in test on the plurality of devices under test, wherein the system is further provided with variable flow rate means for varying the flow rate of the coolant flowing through the channels formed in the cooling blocks, each cooling block is formed with a second accommodating space for accommodating the measurement block, and each measurement block is accommodated in the second accommodating space in a state with a layer of air formed with the cooling block so as to be insulated from the cooling block.

In the present invention, there is provided a burn-in system adjusting the temperatures of a plurality of devices under test mounted on a burn-in board by cooling blocks and simultaneously performing a burn-in test on those devices under test, wherein the system is further provided with variable flow rate means for varying the flow rates of coolant flowing through channels formed in the cooling blocks, each cooling block is formed with a second accommodating space, and a measurement block is accommodated in this second accommodating space in a state maintaining clearance.

Due to this, without providing a heater or other heating means, each variable flow rate means can vary the flow rate of the coolant to adjust the cooling thermal resistance of the cooling block and therefore the temperature of each device under test can be easily adjusted, so when simultaneously performing a burn-in test on a plurality of electronic devices, it is possible to independently and accurately control the temperature of each electronic device.

Further, a layer of air is formed between each cooling block for cooling a device under test and a measurement block for measuring the temperature of the device under test, the measurement block is insulated from the cooling block, and the measurement block is made thermally floating in state with respect to the cooling block, so the temperature of the device under test can be accurately measured and the precision of temperature adjustment is improved.

Further, to achieve the object, according to a third aspect of the present invention, there is provided a burn-in system provided with at least cooling blocks formed with channels able to carry a coolant for cooling a plurality of devices under test mounted on a burn-in board and formed with openings communicating with the channels at their front end faces, measurement blocks having measuring means for measuring temperatures of the devices under test, variable flow rate means for varying flow rates of the coolant through channels formed in the cooling blocks, and coolant recovering means for recovering coolant flowing through the channels, each cooling block formed with a second accommodating space for accommodating a measurement block, each measurement block accommodated in a second accommodating space in a state with a layer of air formed with the cooling block so as to be insulated from the cooling block, and pushing against the devices under test mounted on the burn-in board the cooling blocks and the measurement blocks to bring the coolant into direct contact with the devices under test through the openings and simultaneously conducting a burn-in test on the plurality of devices under test and, when the burn-in test ends, using the coolant recovering means to recover the coolant.

In the present invention, there is provided a burn-in system adjusting the temperatures of a plurality of devices under test mounted on a burn-in board and simultaneously performing a burn-in test on the devices under test, wherein the system is further provided with variable flow rate means for varying the flow rates of coolant flowing through channels formed in the cooling blocks and the front end faces of the cooling blocks are formed with openings communicating with the channels. Further, when pushing a cooling block against an electronic device, the coolant supplied through the opening is made to directly contact the surface of the device under test so as to cool the device under test when performing the burn-in test. After the burn-in test, the coolant recovering means recovers the coolant from the surface of the device under test.

Due to this, without providing a heater or other heating means, each variable flow rate means can vary the flow rate of the coolant to adjust the temperature of the individual device under test directly and easily, so when simultaneously performing a burn-in test on a plurality of electronic devices, it is possible to independently and accurately control the temperature of each electronic device.

While not particularly limited in the invention, preferably each measurement block is supported with play with respect to the cooling block, and in the state where a measurement block is not in contact with the device under test, the front end face of the measurement block sticks out relative to the front end face of the cooling block.

By making the front end face of each measurement block stick out from the front end face of the cooling block, when contacting a device under test, the measurement block contacts the device under test before the measurement block. Further, as explained above, since each measurement block is supported with play with respect to the cooling block in a state with a clearance maintained between the measurement block and the inside wall surface of the second accommodating space, that is, the measurement block is in a mechanical floating state with respect to the cooling block, the measurement block contacting the device under test before the cooling block operates fit against that device under test. Due to this, the front end face of the measurement block Closely contacts the device under test, so the temperature of the device under test can be more accurately measured.

While not particularly limited in the invention, preferably each measurement block and cooling block are provided between them with second biasing means for biasing the measurement block to the front end face side.

By providing second biasing means between the measurement block and the cooling block, when the measurement block contacts a device under test, that measurement block is suitably pushed against and closely contacts the device under test, so the temperature of the device under test can be more accurately measured.

While not particularly limited in the invention, preferably in a state where a measurement block is not in contact with the device under test, the second biasing means cause the measurement block to be biased to the front end side and cause part of the measurement block to contact the cooling block.

By bringing part of the measurement block into contact with the cooling block before contacting a device under test, it becomes possible to monitor the temperature of the cooling block or the state of operation of the heating means of the heating block or to enable self-diagnosis of that measuring means.

While not particularly limited in the invention, preferably the system is further provided with temperature adjustment boards supporting a plurality of the cooling blocks at frames with play and a burn-in chamber able to hold each burn-in board and having the temperature adjustment boards, each temperature adjustment board being provided in the burn-in chamber so that each cooling block faces a device under test mounted on the burn-in board.

By further providing temperature adjustment boards supporting a plurality of cooling blocks at a frame with play, the cooling blocks are set in a mechanically floating state with respect to the temperature adjustment boards.

Due to this, the variations in height of inclination of the devices under test mounted on the burn-in board can be absorbed, so the cooling blocks can be made to closely contact the devices under test and the temperature of the devices under test can be accurately adjusted.

While not particularly limited in the invention, preferably each cooling block is supported on a frame through third biasing means biasing the cooling block toward a burn-in board facing it in the burn-in chamber.

By providing third biasing means between each cooling block and the frame, when a cooling block contacts a device under test, that cooling block is suitably pushed against and closely contacts the device under test, so the temperature of the device under test can be more accurately adjusted.

While not particularly limited in the invention, preferably at least part of the channels formed at the plurality of cooling blocks are connected in series.

By connecting the channels in series in this way, compared with when connecting all of them in parallel, it is possible to keep down the increase in the number of connection points of the pipes in the temperature adjustment boards and possible to improve the reliability of the pipes.

While not particularly limited in the invention, preferably each cooling block is provided with a bypass for making the coolant bypass the channels.

By providing such a bypass in each cooling block, when adjusting the temperature of a device under test with a relatively low power consumption and not that large an amount of self generated heat, the flow rate of the coolant flowing through the channels can be suitably secured and the temperature of the device under test can be suitably adjusted.

While not particularly limited in the invention, preferably each variable flow rate means is provided in a channel or a bypass. Further, while not particularly limited in the invention, preferably the system is further provided with a chiller able to adjust the temperature and flow rate of the coolant.

While not particularly limited in the invention, preferably the temperature adjustment boards have first cooling blocks formed with the bypasses and second cooling blocks not formed with the bypasses.

By providing the same temperature adjustment board with two different types of cooling blocks with different cooling performances due to the presence/absence of bypasses, a single burn-in system can handle DUTs with a wide range of amounts of self-generated heat.

While not particularly limited in the invention, preferably the burn-in chamber has a plurality of the temperature adjustment boards, one temperature adjustment board among the plurality of temperature adjustment boards has first cooling blocks formed with the bypasses and the other temperature adjustment boards have second cooling blocks not formed with the bypasses. Due to this, a single burn-in system can handle DUTs with a wide range of amounts of self-generated heat.

While not particularly limited in the invention, preferably each temperature adjustment board has at least two types of cooling blocks having different thermal resistances between the coolant and the devices under test.

By providing each temperature adjustment board with at least two types of cooling blocks with different thermal resistances between the coolant and the devices under test, a single burn-in system can handle DUTs with a wide range of amounts of self-generated heat.

While not particularly limited in the invention, preferably the burn-in chamber has a plurality of the temperature adjustment boards, and a thermal resistance between the coolant and the devices under test in coolant blocks in one temperature adjustment board among the plurality of temperature adjustment boards and a thermal resistance between the coolant and the devices under test in coolant blocks of the other temperature adjustment boards are different. Due to this, a single burn-in system can handle DUTs with a wide range of amounts of self-generated heat.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, embodiments of the present invention will be explained based on the drawings.

First Embodiment

Figure 1:
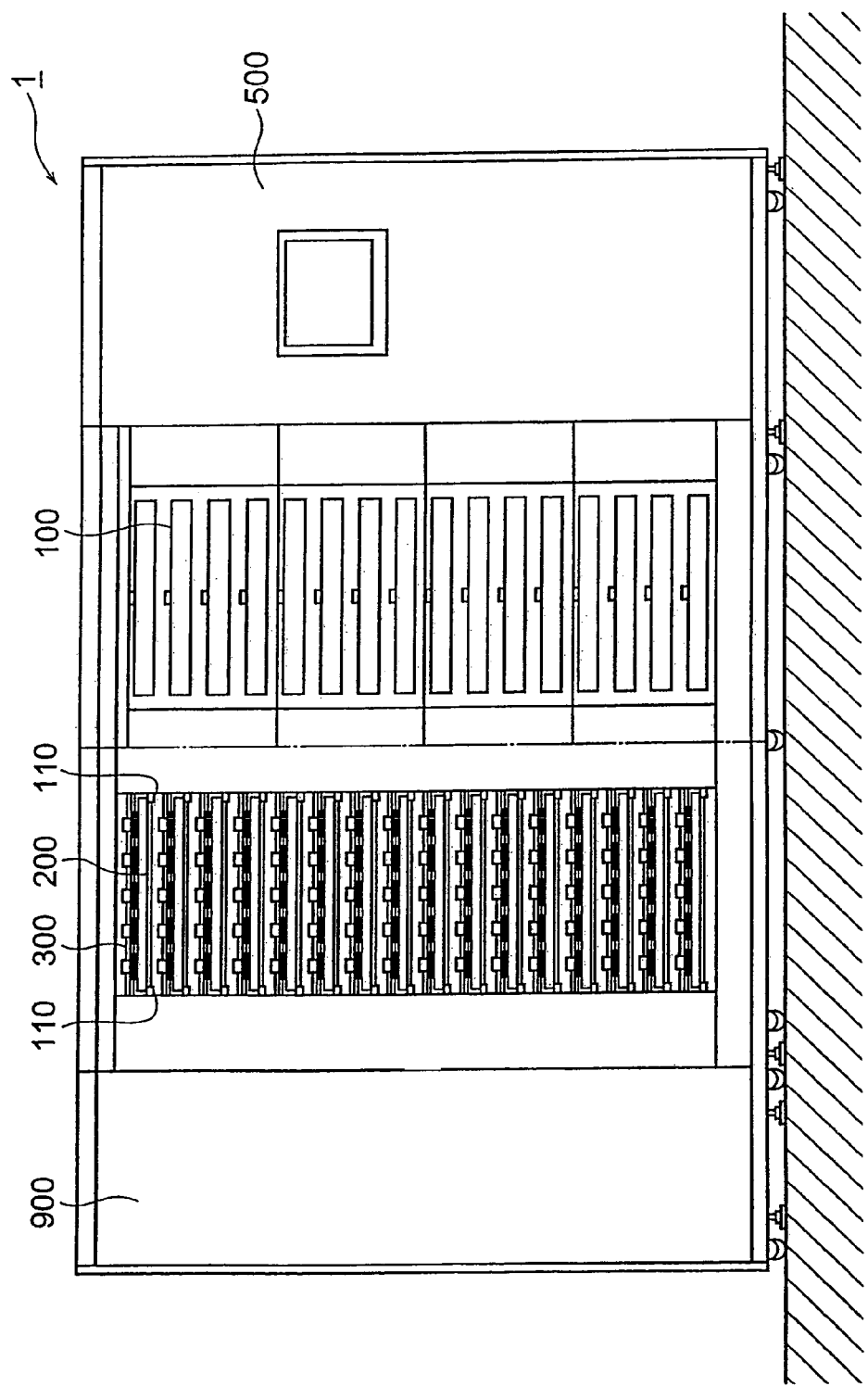
FIG. 1 is a front view of an overall burn-in system according to a first embodiment of the present invention.
Figure 2:
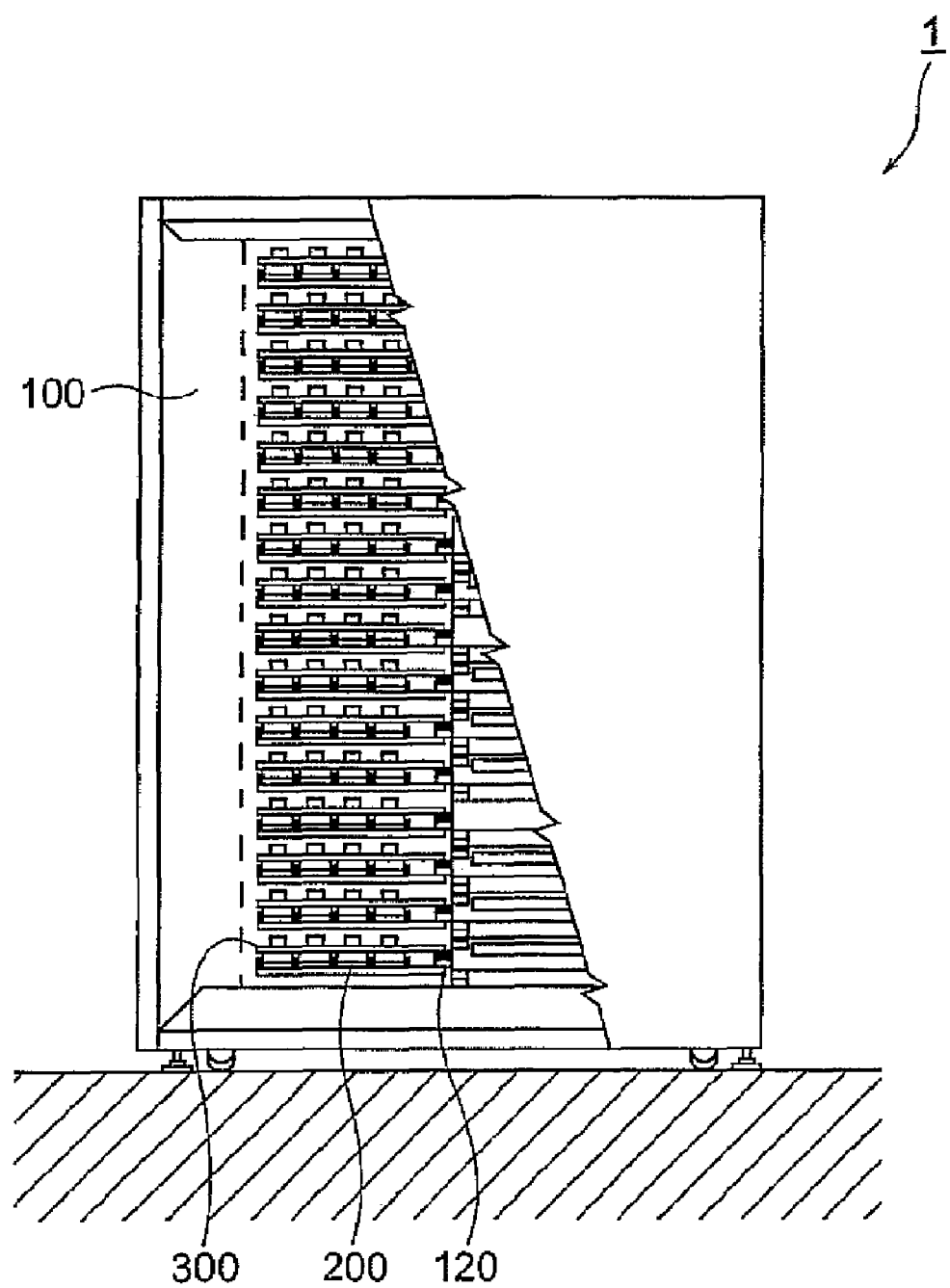
FIG. 2 is a side view of the overall burn-in system shown in FIG. 1.
Figure 3:
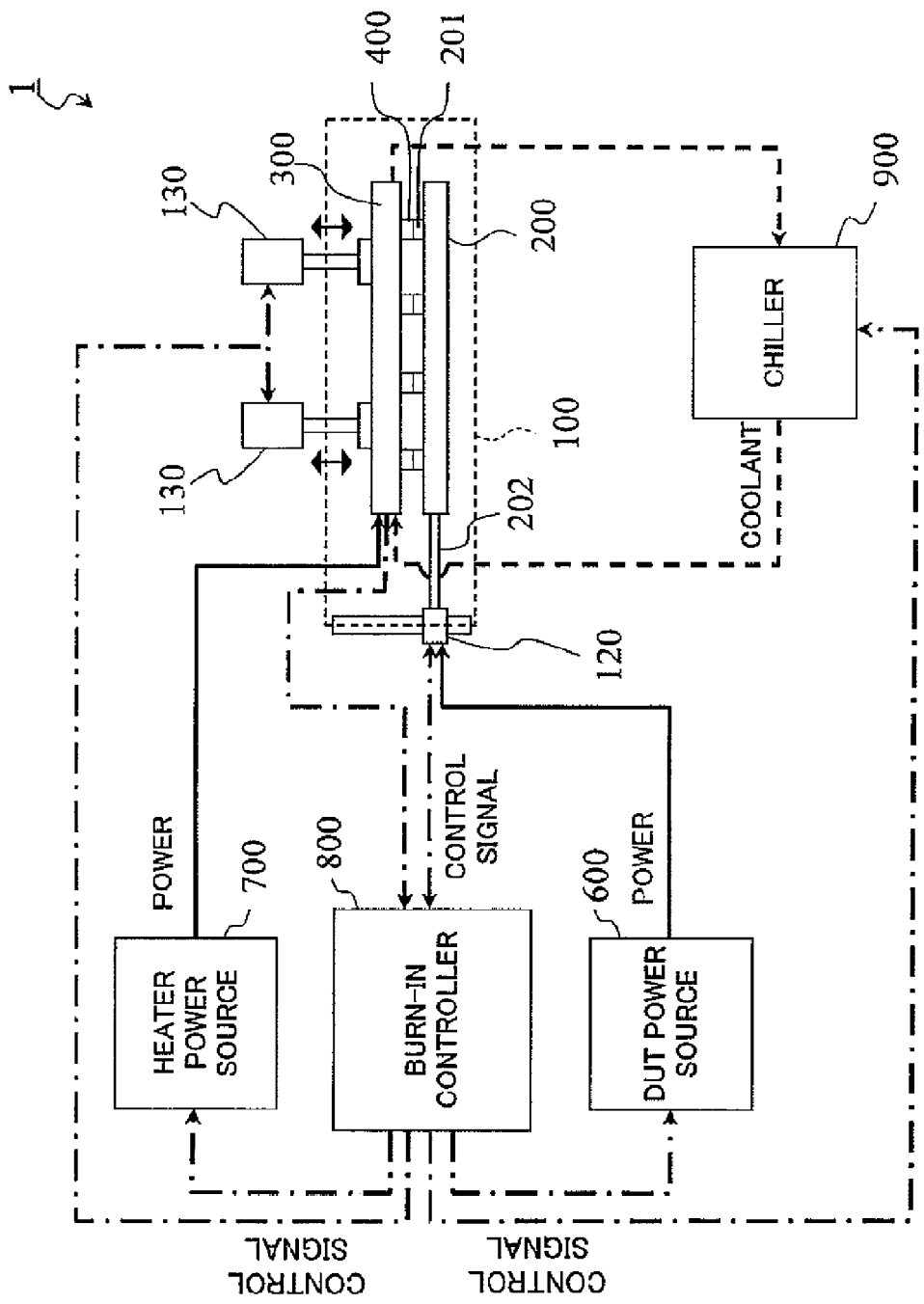
FIG. 3 is a conceptual view of the system configuration of the burn-in system shown in FIG. 1.
Figure 4:
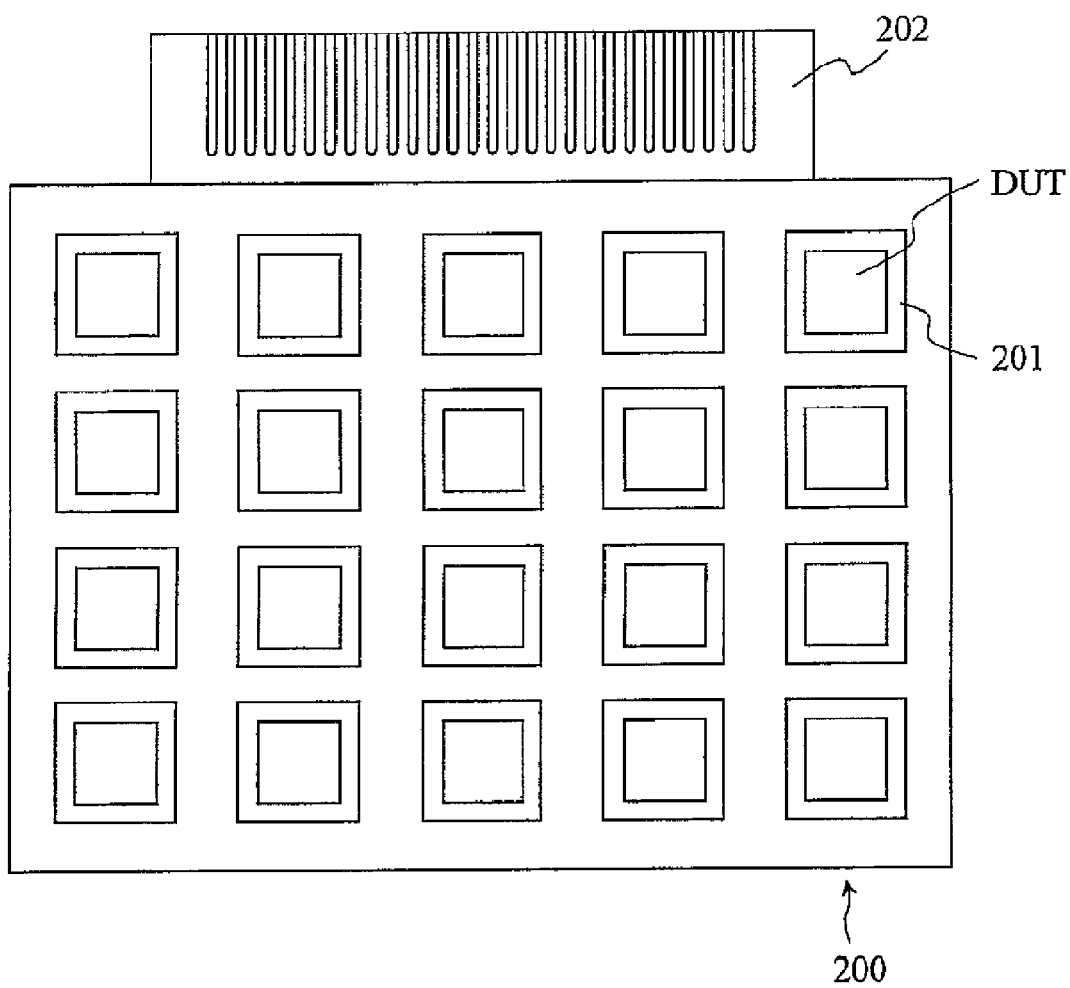
FIG. 4 is a plan view of an overall burn-in board mounting DUTs in the first embodiment of the present invention.

FIG. 1 is a front view of an overall burn-in system according to a first embodiment of the present invention, FIG. 2 is a side view of the overall burn-in system shown in FIG. 1, FIG. 3 is a conceptual view of the system configuration of the burn-in system shown in FIG. 1, and FIG. 4 is a plan view of an overall burn-in board mounting DUTs in the first embodiment of the present invention.

First, explaining the overall configuration of the burn-in system 1 according to the first embodiment of the present invention, this burn-in system 1, as shown in FIG. 1 to FIG. 3, is provided with a burn-in chamber 100 which can hold burn-in boards 200 on which for example DUTs (devices under test) such as IC chips (corresponding to "device under test" in the claims) are mounted and has temperature adjustment hoards 300 with temperature adjustment heads 400 for adjusting the DUTs in temperature arranged facing the burn-in boards 200; a DUT power source 600 for supplying the DUTs with power voltage; a heater power source 700 for driving heaters of the temperature adjustment heads 400 of the temperature adjustment boards 300; a burn-in controller 800 for controlling the DUTs in temperature and controlling the supply of the power voltage or signals etc.; and a chiller 900 for supplying a coolant to the temperature adjustment heads 400 of the temperature adjustment board 300.

This burn-in system 1 is a monitored burn-in system which pushes the temperature adjustment heads 400 of the temperature adjustment boards 300 against the DUTs, uses heaters and coolants to adjust the DUTs in temperature and apply thermal stress, and supplies power voltage and supplies the input circuits of the DUTs with signals close to those of actual operation for screening and for monitoring of the characteristics of the output circuits of the DUTs.

Further, this burn-in system 1, for example, can simultaneously conduct burn-in tests on 640 DUTs with different amounts of self-generated heat such as 0 to 100 W level medium heat emitting types, 100 to 200 W level high heat emitting types, or, 200 to 300 W level superhigh heat emitting types.

The burn-in chamber 100 of the burn-in system 1 according to the present embodiment, as shown in FIG. 1 and FIG. 2, has an inside chamber defined by heat insulating walls etc. and a door able to be opened and closed for loading and unloading burn-in boards to and from the inside chamber. Further, the inside chamber of this burn-in chamber 100 is provided with 16 levels and two rows of slots 110 for supporting the burn-in boards 200 and therefore can hold a total of 32 burn-in boards 200. Note that the number and arrangement of the slots 110 in this burn-in chamber 100 are not particularly limited in the present invention and can be freely set in consideration of the test efficiency etc.

Further, as shown in FIG. 2, the back of each slot 110 is provided with a connector 120 into which an edge connector 202 of a burn-in board 200 (see FIGS. 3 and 4) can be inserted. This connector 120, as shown in FIG. 3, is electrically connected to the DUT power source 600 and the burn-in controller 800. Note that FIG. 3 only illustrates one set of the burn-in board 200 and temperature adjustment board 300, but the other 31 sets of burn-in boards 200 and temperature adjustment boards 300 are similarly connected to the DUT power source 600, heater power source 700, burn-in controller 800, and, chiller 900. Further, the air in the burn-in chamber 100 is circulated by a fan (not shown) etc. so as to keep heated air around the DUTs from stagnating there, but is not controlled to the extent of adjusting the DUTs in temperature.

Here, a burn-in board 200 held in the burn-in chamber 100 will be explained. This burn-in board 200, as shown in FIG. 4, is comprised of 20 burn-in sockets 201 able to mount DUTs arranged on a board with superior heat resistance in four rows and five columns. One side edge of that board is formed with an edge connector 202 able to be inserted into a connector 120 formed in the burn-in chamber 100. Note that the number and arrangement of the burn-in sockets 201 on the burn-in board 200 are not particularly limited in the present invention and can be freely set in consideration of the test efficiency etc.

That board is further formed with a printed circuit (not shown) electrically connecting this edge connector 202 and the burn-in sockets 201. When the edge connector 202 of the burn-in board 200 is inserted into the connector 120 of the burn-in chamber 100, the DUTs mounted on the burn-in board 200 are electrically connected to the DUT power source 600 and the burn-in controller 800 through this printed circuit and the burn-in sockets 201. Note that while not particularly illustrated, the work for insertion and removal of DUTs to and from the burn-in sockets 201 of this burn-in board 200 is performed for example outside of the burn-in system 1 using an inserter/remover, loader/unloader, etc.

The burn-in chamber 100, as shown in FIG. 1 to FIG. 3, further is provided with 32 temperature adjustment boards 300 for adjusting the DUTs in temperature arranged so as to face the burn-in boards 200 supported at the slots 110. Each temperature adjustment board 300 is able to be raised and lowered in the vertical direction by air cylinders 130 (see FIG. 3) under the control of the burn-in controller 800 so that, at the time of a burn-in test, the temperature adjustment heads 400 can be brought into contact with the DUTs and, at the time of non-contact, the temperature adjustment heads 400 can be moved away from the DUTs. Note that temperature adjustment board 300 will be explained later in detail.

The DUT power source 600 of the burn-in system 1 according to the present embodiment, as shown in FIG. 3, is connected to the DUTs through the connectors 120 of the burn-in chamber 100 and the edge connectors 202, printed circuits, and burn-in sockets 201 of the burn-in boards 200 to be able to supply power voltage to the DUTs and is controlled by the burn-in controller 800. Further, the heater power source 700, as shown in FIG. 3, is connected so as to be able to supply power to the heaters (explained later) provided at the temperature adjustment boards 300 in the burn-in chamber 100 and is controlled by the burn-in controller 800.

The burn-in controller 800 of the burn-in system 1 according to the present embodiment controls the temperatures of the DUTs during the burn-in test, the voltages supplied to the DUTs, and the signals supplied to them. In addition, it judges any DUT exhibiting abnormal reactions during the burn-in tests to be defective, for example, holds the serial number of the DUT linked with the number of the slot in the burn-in chamber 100 and the position on the burn-in board 200, and feeds back the test results.

This burn-in controller 800, as shown in FIG. 3, is connected to temperature sensors (explained later) provided at the temperature adjustment boards 300 in the burn-in chamber 100 so as to enable detection of the temperatures of the DUTs and is connected to the heater power source 600 and chiller 900 so as to enable control of the temperatures of the DUTs. Further, it is connected to the DUT power source 700 so as to enable control of the power voltage supplied to the DUTs.

These DUT power source 600, heater power source 700, and burn-in controller 800 are held in an instrument rack 500 shown in FIG. 1.

The chiller 900 of the burn-in system 1 according to the present embodiment causes a fluorine-based inert liquid (for example, 3M Fluorinert FC-323) or other coolant to circulate to the cooling blocks (explained later) of the temperature adjustment board 300 in the burn-in chamber 100 and can adjust the coolant in temperature and flow rate under the control of the burn-in controller 800. Note that the coolant in the present invention is not limited to the above liquid and for example may also be a gas.

Below, a temperature adjustment board 300 used in the burn-in system 1 according to the present embodiment will be explained.

Figure 5:
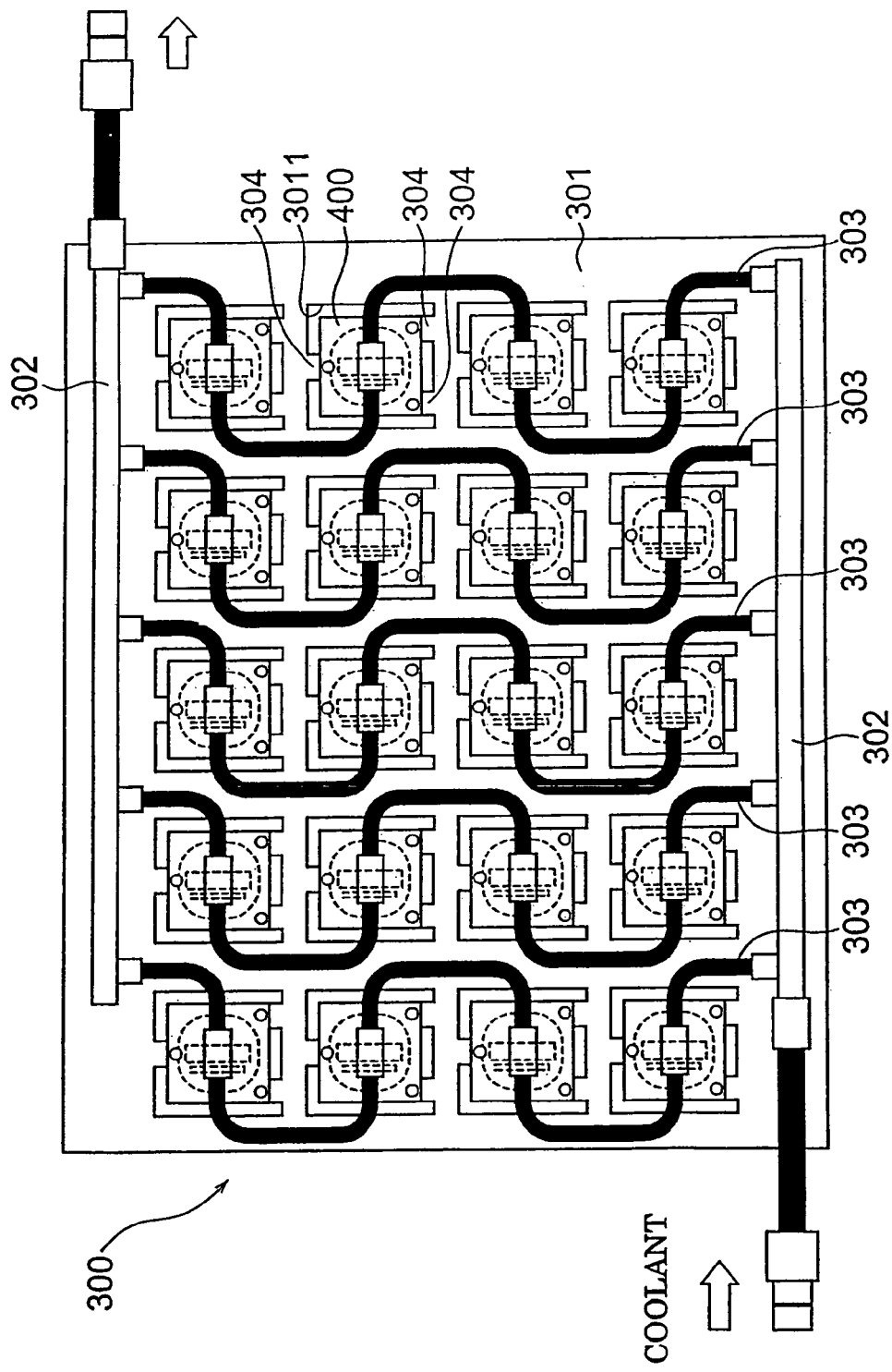
FIG. 5 is a plan view of a temperature adjustment board used in a burn-in system according to the first embodiment of the present invention.
Figure 6:
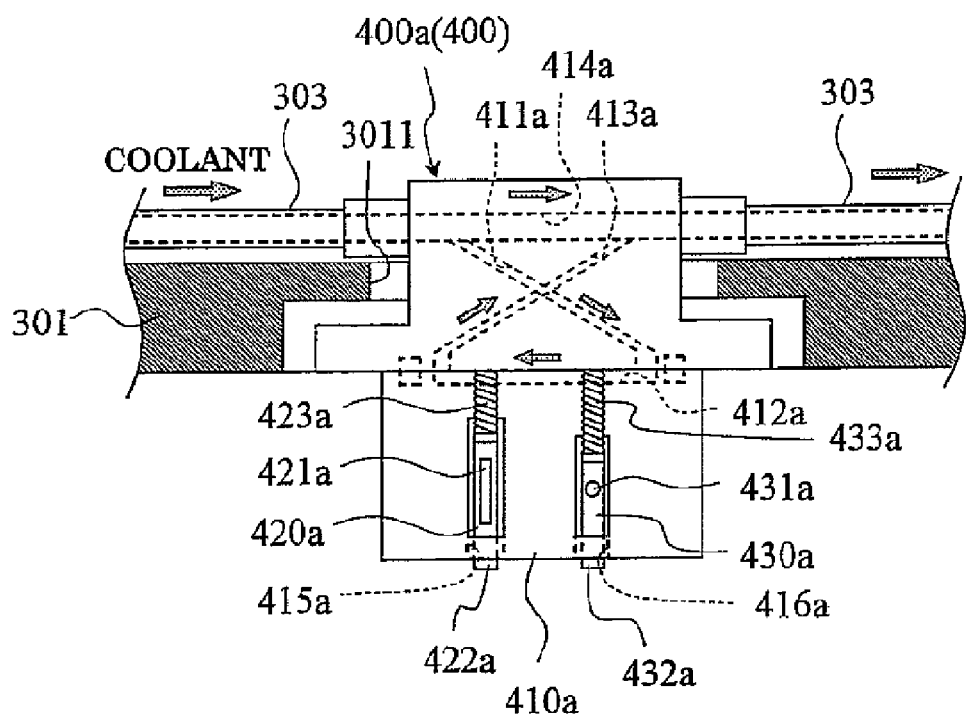
FIG. 6 is a side view of a first temperature adjustment head supported on the temperature adjustment board shown in FIG. 5.
Figure 7:
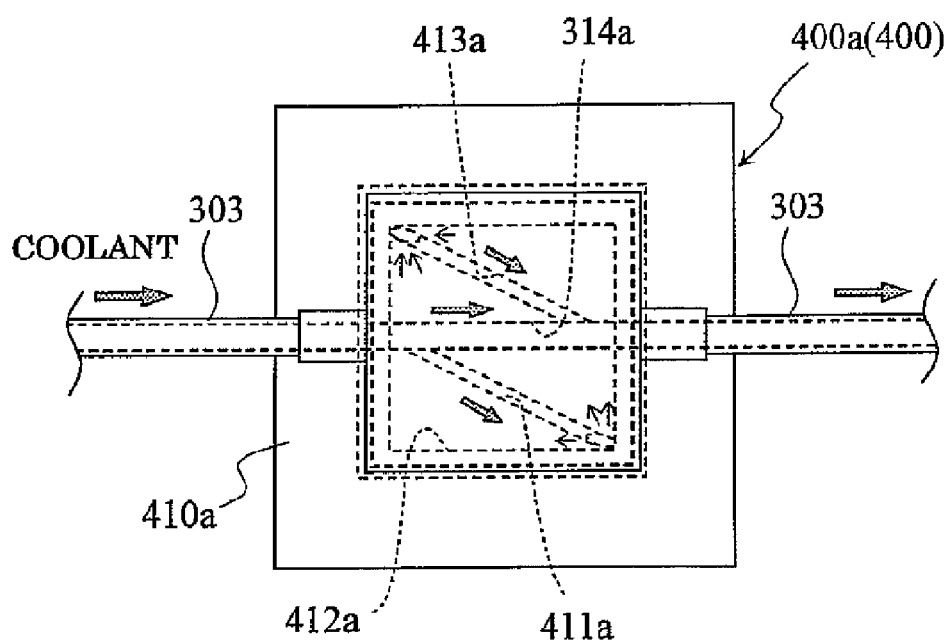
FIG. 7 is a top plan view of the first temperature adjustment head shown in FIG. 6.
Figure 8:
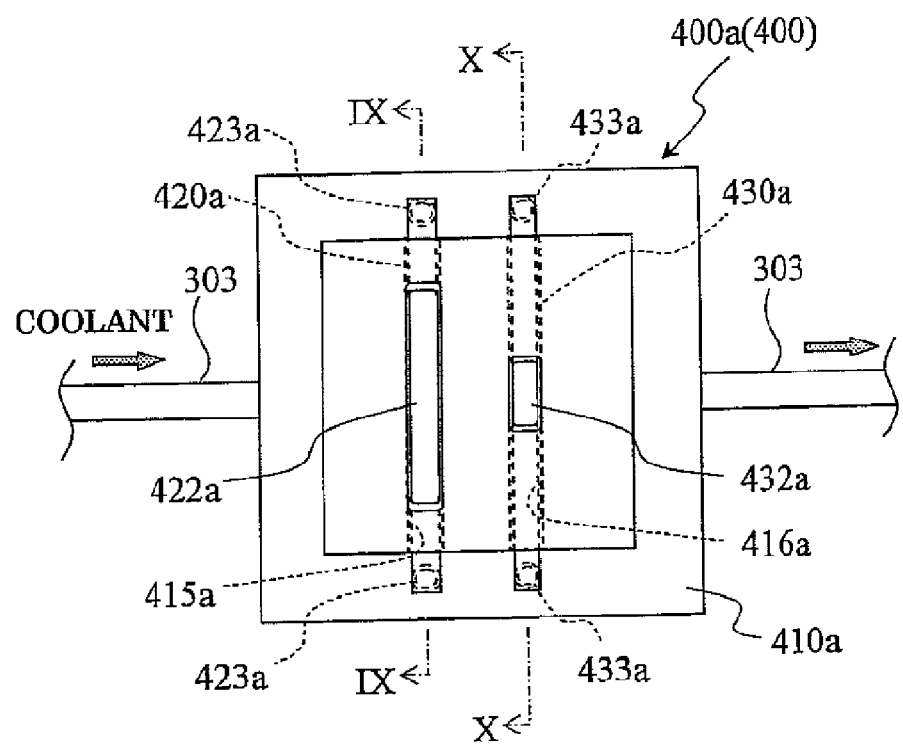
FIG. 8 is a bottom plan view of the first temperature adjustment head shown in FIG. 6.
Figure 9:
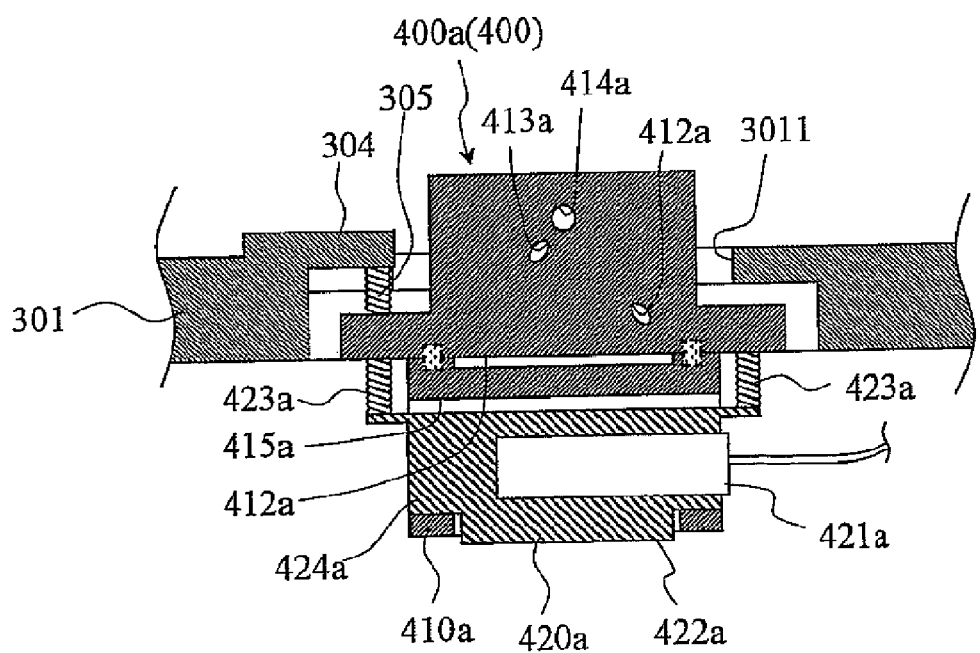
FIG. 9 is a cross-sectional view of the first temperature adjustment head along the line IX-IX of FIG. 8.
Figure 10:
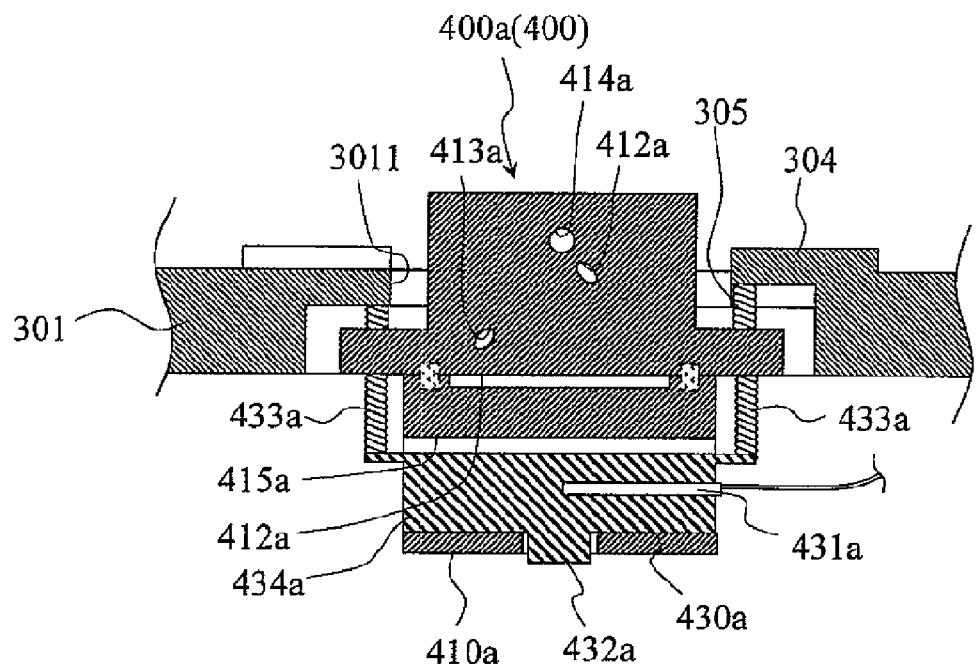
FIG. 10 is a cross-sectional view of the first temperature adjustment head along the line X-X of FIG. 8.
Figure 11:
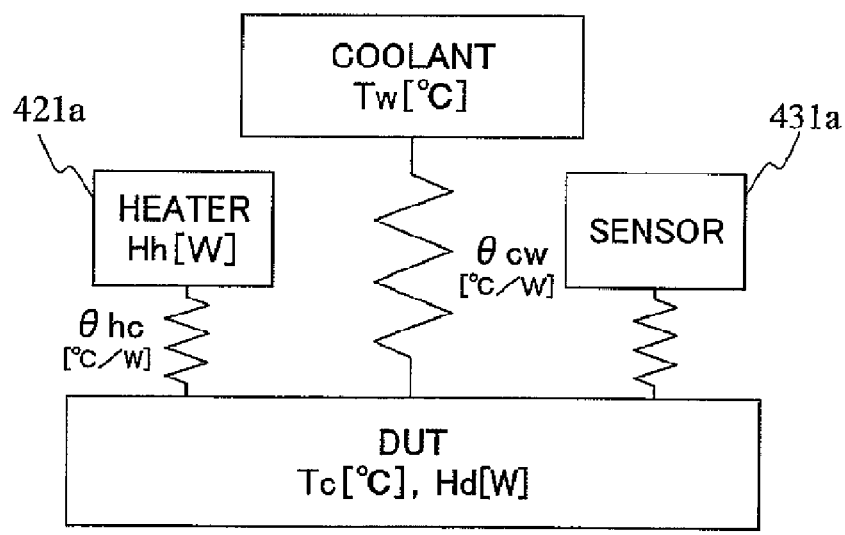
FIG. 11 is a heat conduction model of a temperature adjustment head in the first embodiment of the present invention.
Figure 12:
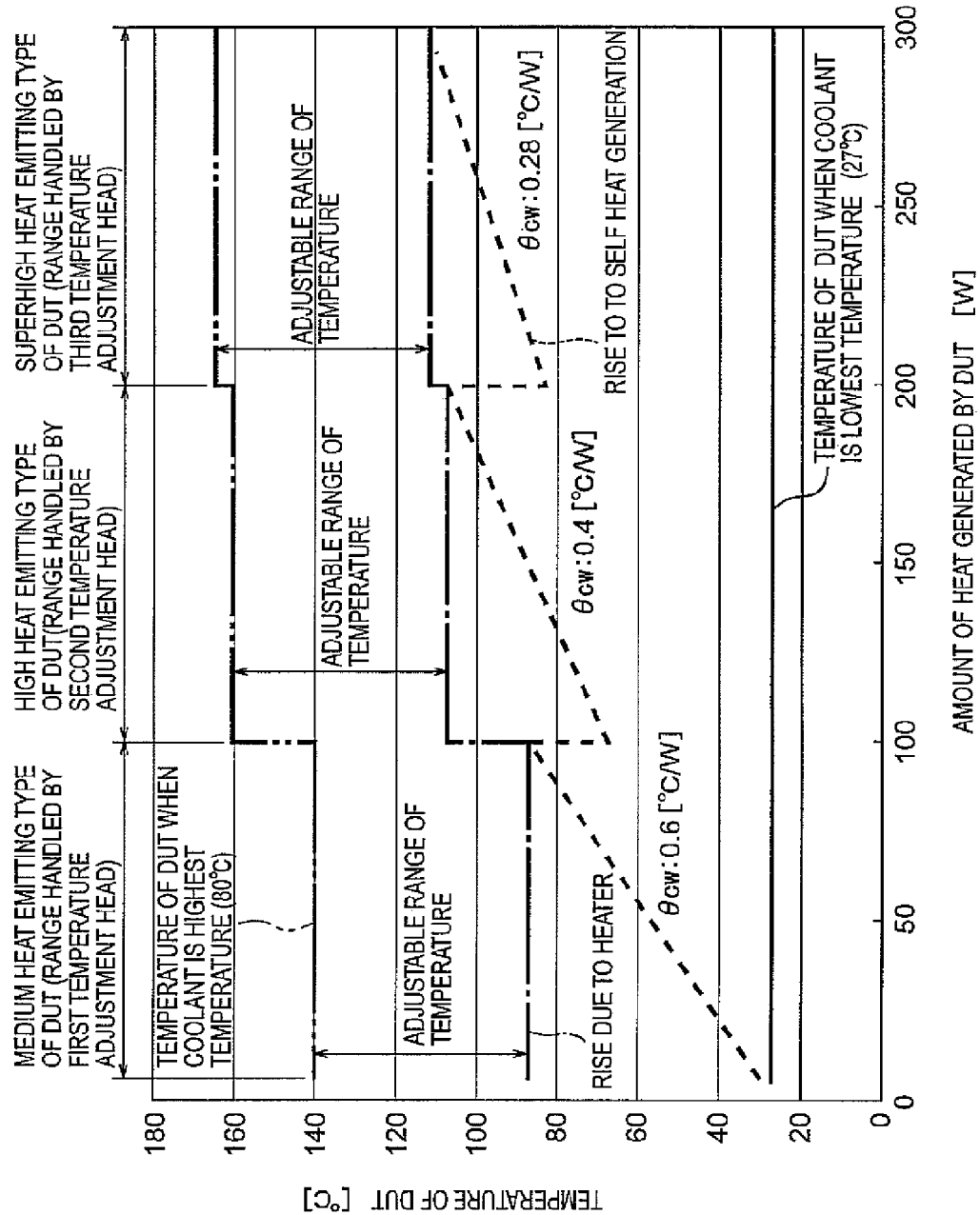
FIG. 12 is a graph of the adjustable range of temperature of first to third temperature adjustment heads in a burn-in system according to the first embodiment of the present invention.
Figure 13:
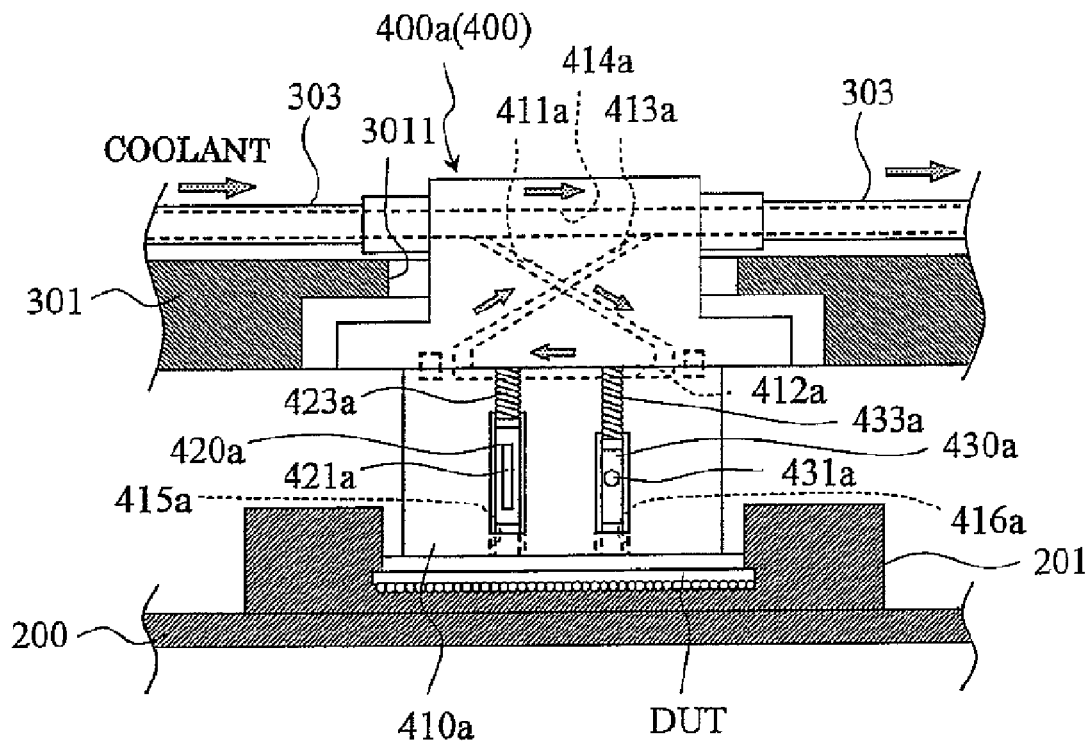
FIG. 13 is a view of the state of temperature adjustment of a DUT by a first temperature adjustment head in the first embodiment of the present invention.
Figure 14:
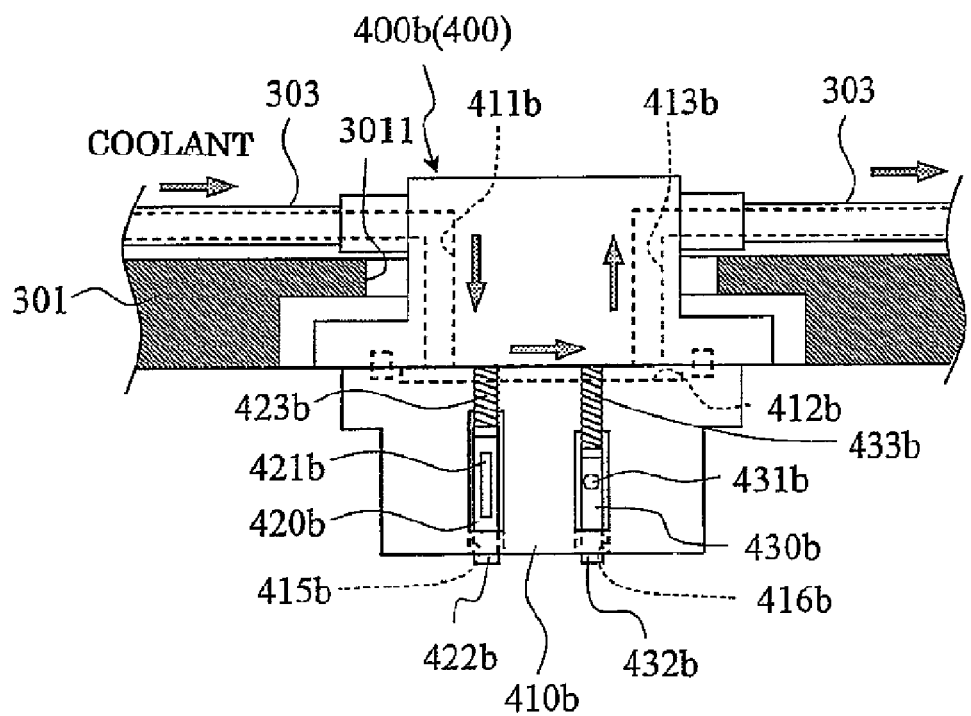
FIG. 14 is a side view of a second temperature adjustment head used in a burn-in system according to the first embodiment of the present invention.
Figure 15:
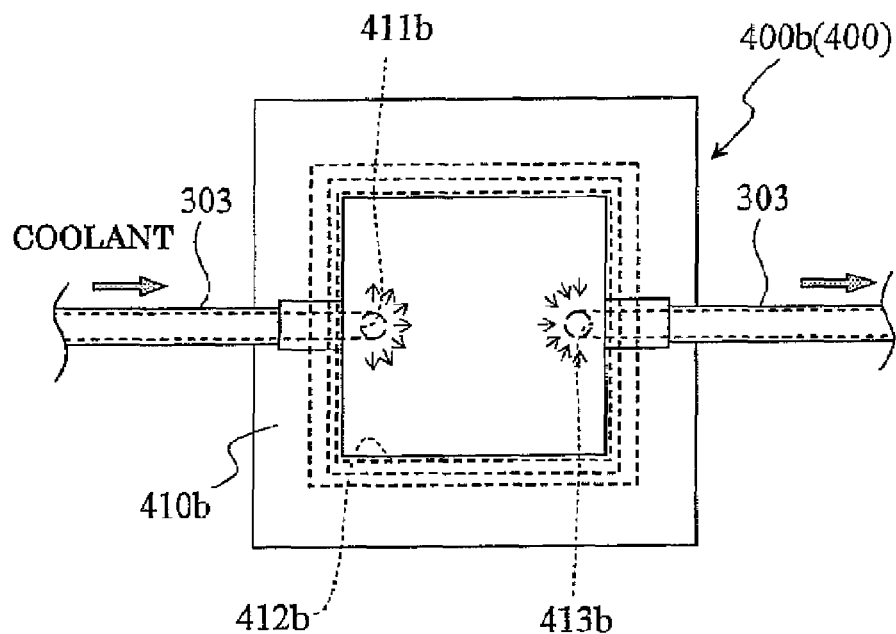
FIG. 15 is a bottom plan view of the second temperature adjustment head shown in FIG. 14.
Figure 16:
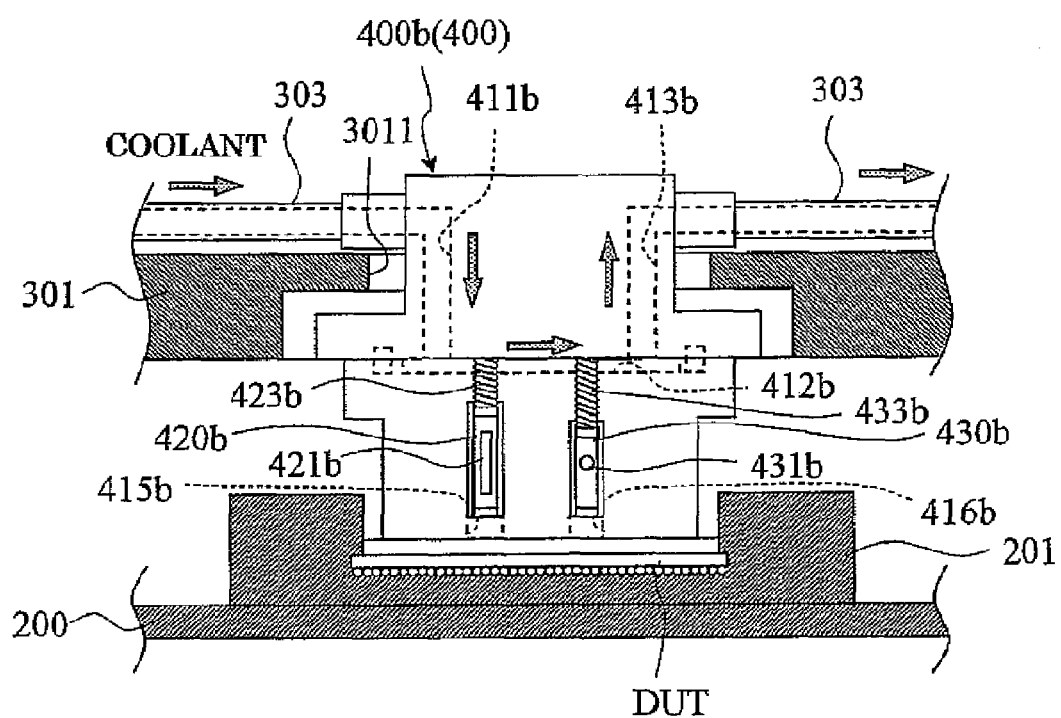
FIG. 16 is a view of the state of temperature adjustment of a DUT by a second temperature adjustment head in the first embodiment of the present invention.

FIG. 5 is a plan view of a temperature adjustment board used in a burn-in system according to the first embodiment of the present invention, FIG. 6 is a side view of a first temperature adjustment head supported on the temperature adjustment board shown in FIG. 5, FIG. 7 is a top plan view of the first temperature adjustment head shown in FIG. 6, FIG. 8 is a bottom plan view of the first temperature adjustment head shown in FIG. 6, FIG. 9 is a cross-sectional view of the first temperature adjustment head along the line IX-IX of FIG. 8, FIG. 10 is a cross-sectional view of the first temperature adjustment head along the line X-X of FIG. 8, FIG. 11 is a heat conduction model of a temperature adjustment head in the first embodiment of the present invention, FIG. 12 is a graph of the adjustable range of temperature of first to third temperature adjustment heads in a burn-in system according to the first embodiment of the present invention, FIG. 13 is a view of the state of temperature adjustment of a DUT by a first temperature adjustment head in the first embodiment of the present invention, FIG. 14 is a side view of a second temperature adjustment head used in a burn-in system according to the first embodiment of the present invention, FIG. 15 is a bottom plan view of the second temperature adjustment head shown in FIG. 14, and FIG. 16 is a view of the state of temperature adjustment of a DUT by a second temperature adjustment head in the first embodiment of the present invention.

The temperature adjustment board 300 of the present embodiment, as shown in FIG. 5 and FIG. 6, is provided with 20 temperature adjustment heads 400 for adjusting the DUTs in temperature, a frame 301 for supporting the temperature adjustment head 400s, and main pipes 302 and branch pipes 303 for supplying the cooling blocks of the temperature adjustment heads 400 with coolant from the chiller 900.

The frame 301 of this temperature adjustment board 300, as shown in FIG. 5, is a flat plate member formed with four rows and five columns, or a total of 20, openings 3011 corresponding to the arrangement of the DUTs mounted on a burn-in board 200 (arrangement of burn-in sockets 201). Further, as shown in FIG. 6, each opening 3011 has a temperature adjustment head 400 inserted into it. As shown in FIG. 9 and FIG. 10, each temperature adjustment head 400 is supported with play with respect to the frame 301 by supporting parts 304 of the frame 301 via third springs 305 (third biasing means) pressing that temperature adjustment head 400 to the facing burn-in board 200 side.

By setting each of the temperature adjustment heads 400 in a mechanical floating state with respect to the temperature adjustment board 300 in this way, variations in height or inclination of the DUTs mounted on the burn-in board 200 can be absorbed by the temperature adjustment heads 400.

Further, by having each of the temperature adjustment heads 400 supported by the frame 301 via third springs 305 pushing the temperature adjustment heads 400 to the burn-in board 200 side, when each temperature adjustment head 400 contacts a DUT, that temperature adjustment head 400 can be made to be suitably pushed against and closely contact the DUT.

The temperature adjustment head 400 in the first embodiment of the present invention includes a first temperature adjustment head 400*a* for example for 0 to 100 W level medium heat emitting types of DUTs, a second temperature adjustment head 400*b* for example for 100 to 200 W level high heat emitting types of DUTs, and a third temperature adjustment head for example for 200 to 300 W level superhigh heat emitting types of DUTs. By selecting the suitable type from among the total three types of temperature adjustment heads by considering the amount of self generated heat of the DUTs in question, it becomes possible to handle DUTs of a broad range of amount of self generated heat by a single burn-in system 1 (see FIG. 12). Note that the second and third temperature adjustment heads will be explained in detail later, but no matter which temperature adjustment heads are employed, the temperature adjustment board 300 is configured the same except for the temperature adjustment heads.

Each first temperature adjustment head 400, as shown in FIG. 6, is provided with a cooling block 410*a* for cooling a DUT, a heater block 420*a* for heating a DUT, and a sensor block 430*a* for measuring the temperature of a DUT.

The cooling block 410*a* of this first temperature adjustment head 400*a* is made of aluminum, copper, or another material superior in heat conductivity. As shown in FIG. 6 and FIG. 7, this cooling block 410*a* is formed inside it with an inside space 412*a* for circulation of the coolant supplied from the chiller 900. Further, this cooling block 410*a* is formed inside it with an entrance side channel 411*a* connecting a branch pipe 303 and the inside space 412*a* so as to extend downward at an angle along the direction of progression of the coolant and is formed inside it with an exit side channel 413*a* connecting the inside space 412a and a branch pipe 303 so as to extend upward at an angle along the direction of progression of the coolant. The flow of the coolant is utilized for circulating it through the inside space 412a.

Further, in this first temperature adjustment head 40a, the coolant supplied from the chiller 900 through a main pipe 302 and branch pipe 303 to a cooling block 410a flows from the branch pipe 303 through the entrance side channel 411a to the inside space 412a so can cool the DUT contacting that cooling block 410a.

Further, between the entrance side channel 411a and the exit side channel 413a, a bypass 414a is formed branching off from the entrance side channel 411a and the exit side channel 413a to make the coolant bypass the inside space 412a.

The medium heat emitting type of DUT covered by this first temperature adjustment head 400a has a relatively low amount of self generated heat compared with the above-mentioned high heat emitting or superhigh heat emitting type of DUT, so if circulating a similar amount of coolant as with the second and third temperature adjustment heads for other types of DUTs through the inside space 412a, the head will be overcooled and may not be able to impart the predetermined thermal stress to the DUT. As opposed to this, in the first temperature adjustment head 400a of the present embodiment, the excess flow of coolant is made to bypass the space by the bypass 414a so as to limit the flow of coolant passing through the inside space 412a. Due to this, when adjusting the temperature of a DUT with a relatively low amount of self generated heat, it is possible to make the flow of the coolant through the inside space suitable and possible to suitably adjust the DUT in temperature.

This cooling block 410a is formed with a first accommodating space 415a for accommodating the heater block 420a and a second accommodating space 416a for accommodating the sensor block 430a.

This first accommodating space 415a, as shown in FIG. 6, FIG. 8, and FIG. 9, has a size enabling a predetermined clearance to be secured between the heater block 420a and the inside wall surfaces of that first accommodating space 415a. Further, this first accommodating space 415a is formed to open at the surface of the cooling block 410a contacting the DUT.

Further, the second accommodating space 416a similarly, as shown in FIG. 6, FIG. 8, and FIG. 10, has a size enabling a predetermined clearance to be secured between the sensor block 430a and the inside wall surfaces of that second holding space 416h. Further, this second holding space 416a is formed to open at the surface of the cooling block 410a contacting the DUT.

The heater block 420a of the first temperature adjustment head 400a, like the cooling block 410a, is comprised of aluminum, copper, or another material superior in heat conductivity. As shown in FIG. 9, it has a substantially projecting shape overall, is formed at its front end with a projecting part 422a projecting outward, and has for example a 100 W level heat generating heater 421a embedded inside it. This heater 421a, as shown in FIG. 3, is connected to the heater power source 700 so as to be able to be supplied with power from it.

This heater block 420a, as shown in FIG. 6 and FIG. 8, is accommodated in the first accommodating space 415a in a state with a clearance maintained from the inside wall surfaces of the first accommodating space 415a of the cooling block 410a.

Therefore, this heater block 420a is accommodated in a state maintaining clearance from the first accommodating space 415a, a layer of air is formed between the heater block 420a and the cooling block 410a, the cooling block 410a is insulated from the heater block 420a, and the heater block 420a is in a thermally floating state with respect to the cooling block 410a, so heat will not be directly conducted from the heater block 420a to the cooling block 410a.

This heater block 420a, as shown in FIG. 9, is supported at its top two ends through first springs 423a (first biasing means) with respect to the cooling block 410a and is pushed in the downward direction in the figure by the first springs 423a. Due to this, when the heater block 420a is not in contact with the DUT, the heater block 420a is pushed by the first springs 423a so that the shoulders 424 of the heater block 420a contact the cooling block 410a. Further, the pushing action of the first springs 423a causes the front end face of the projecting part 422a to stick out relative to the front end face of the cooling block 410a.

By making the front end face of the projecting part 422a of the heater block 420a stick out relative to the front end face of the cooling block 410a in this way, when contacting the DUT, the heater block 420 contacts it earlier than the cooling block 410a. Further, the heater block 420a is supported with play with respect to the cooling block 410a in a state securing clearance from the inside wall surfaces of the first accommodating space 415a, that is, the heater block 420a is in a mechanically floating state with respect to the cooling block 410a, so the heater block 420a contacting the DUT earlier than the cooling block 410a can operate fit against the DUT.

Further, by providing the first springs 423a between the heater block 420a and the cooling block 410a so as to push the heater block 420a to the DUT side, when the heater block 420a contacts the DUT, that heater block 420a can be made to be suitably pushed against and closely contact the DUT.

The sensor block 430a of the first temperature adjustment head 400a, like the cooling block 410a, is comprised of aluminum, copper, or another material superior in heat conductivity. As shown in FIG. 10, it has a substantially projecting shape overall, is formed at its front end with a projecting part 432a projecting outward, and has for example a platinum sensor or other temperature sensor 431a embedded inside it. This temperature sensor 431a, as shown in FIG. 3, is connected to the above-mentioned burn-in controller 800 so as to be able to transmit the detected temperature of the DUT to it.

This sensor block 430a, as shown in FIG. 6 and FIG. 8, is accommodated in the second accommodating space 416a in a state maintaining clearance with the inside wall surfaces of the second accommodating space 416a of the cooling block 410a.

Therefore, this sensor block 430a is accommodated in a state maintaining clearance with respect to the second accommodating space 416a, a layer of air is formed between the sensor block 430a and the cooling block 410a, the sensor block 430a is insulated from the cooling block 410a, and the sensor block 430a is in a thermally floating state with respect to the cooling block 410a, so heat will not be directly conducted from the cooling block 410a to the sensor block 430a, and the temperature of the DUT can be accurately measured.

This sensor block 430a, as shown in FIG. 10, is supported at its top two ends through second springs 433a (second biasing means) with respect to the cooling block 410a and is pushed in the downward direction in the figure by the second springs 433a. Due to this, when the sensor block 430a is not in contact with the DUT, the sensor block 430a is pushed by the second springs 433a so that the shoulders 434 of the sensor block 430a contact the cooling block 410a. Further, the pushing action of the second springs 433a causes the front end face of the projecting part 433a to stick out relative to the front end face of the cooling block 410a.

By making the front end face of the projecting part 432a of the sensor block 430 stick out relative to the front end face of the cooling block 410a in this way, when contacting the DUT, the sensor block 430a contacts it earlier than the cooling block 410a. Further, the sensor block 430a is supported with play with respect to the cooling block 410a in a state securing clearance from the inside wall surfaces of the second accommodating space 416a, that is, the sensor block 430a is in a mechanically floating state with respect to the cooling block 410a, so the sensor block 430a contacting the DUT earlier than the cooling block 410a can operate fit against the DUT.

Further, by providing the second springs 433a between the sensor block 430a and the cooling block 410a so as to push the sensor block 430a to the DUT side, when the sensor block 423a contacts the DUT, that sensor block 430a can be made to be suitably pushed against and closely contact the DUT.

The first temperature adjustment head 400a configured in this way can be expressed by a heat conduction model such as shown in FIG. 11 since the heater block 420a is thermally floating with respect to the cooling block 410a. When the amount of heat generated by a DUT is Hd [W], the temperature of the coolant is Tw [° C.], the amount of heat generated by the heater 421a is Hh [W], and the thermal resistance between the DUT and coolant is θ cw [° C./W], the temperature Tc [° C.] of the DUT is expressed by Tc=Tw+θ cw(Hh+Hd). From this heat conduction model and equation as well, it is learned that the flow of heat from the heater block 420a having the heater 421a to the surrounding air is extremely small and that the majority of the heat generated at the heater block 420a flows to the DUT, so the heater block 420a can positively raise the temperature of the DUT.

Note that the thermal resistance θ cw spoken of here is comprised of the contact thermal resistance at the contact part of the cooling block 410a and DUT surface, the thermal resistance of that cooling block 410a itself, and the coolant thermal resistance based on the heat conduction area of the coolant, etc.

Note that in the first temperature adjustment head 400a in this embodiment, as shown in FIG. 12, when the coolant temperature can be changed in a range of 27° C.≦Tw≦80° C., by setting the thermal resistance θ cw to 0.6° C./W, it is possible to adjust the temperature Tc of a DUT varying in amount of self generated heat in the range of 0 W to 100 W by the heater 421a and set the DUT temperature to the range of about 87° C. to about 140° C.

Four rows and five columns of such first temperature adjustment heads 400a, as shown in FIG. 5, are supported by the frame 301. This frame 301 is provided with main pipes 302 and branch pipes 303 for supplying coolant from the chiller 900 to the first temperature adjustment heads 400a. One main pipe 302 splits into five parallel branch pipes 303. Each branch pipe 303 serially connects the inside spaces 412a of the four heads 400a arranged in the same line in the frame 301. Note that while not particularly shown, the pressure of the coolant is adjusted by orifices etc. so that the pressures of the coolant at the first temperature adjustment heads 400a become substantially uniform.

By serially connecting the inside spaces 412a of the first temperature adjustment heads 400a in this way, compared with when connecting all temperature adjustment heads in parallel, it is possible to keep down the increase in the number of connection points of the pipes at the temperature adjustment board 300 and possible to improve the reliability of the pipes.

Next, the action of the burn-in system 1 using this first temperature adjustment head 400a will be explained.

Each slot 110 of the burn-in chamber 100 holds a burn-in board 200 mounting DUTs. An edge connector 202 of each burn-in board 200 is inserted into a connector 120 of the burn-in chamber 100. When the door of the burn-in chamber 100 is closed and a start button (not shown) is pushed etc. to start the burn-in test, first the air cylinders 130 are driven to descend based on a control signal from the burn-in controller 800, each temperature adjustment board 300 in the burn-in chamber 100 descends with respect to the burn-in board 200 held in the slot 110, and first temperature adjustment heads 400a arranged on that temperature adjustment board 300 contact the DUTs arranged on the burn-in board 200.

At the time of this contact, the front end face of the projecting part 422a of each heater block 420a sticks out relative to the front end face of the cooling block 410a, so the heater block 420a contacts the device under test before the cooling block 410a. Further, each heater block 420a is in a mechanically floating state with respect to the cooling block 410a, so the heater block 420a contacting the DUT before the cooling block 410a operates fit against the DUT and the front end face of the heater block 420a closely contacts the DUT, so the DOUT can be efficiently raised in temperature.

Further, by providing pushing the heater block 420a to the DUT side between each heater block 420a and cooling block 410a first springs 423a, when a first temperature adjustment head 400a contacts a DUT, that heater block 420a is suitably pushed against and closely contacts the DUT, so the DUT can be more efficiently raised in temperature.

Similarly, since the front end face of the projecting part 432a of each sensor block 430a sticks out relative to the front end face of the cooling block 410a, when a first temperature adjustment head 400a contacts a DUT, the sensor block 430a contacts the DUT before the cooling block 410a. Further, the sensor block 430a is in a mechanically floating state with respect to the cooling block 410a, so the sensor block 430a contacting the DUT before the cooling block 410a operates fit against the DUT and the front end face of the sensor block 430a closely contacts the DUT, so the temperature of the DUT can be more accurately measured.

Further, by providing second springs 433a between each sensor block 430a and cooling block 410a, when a first temperature adjustment head 400a contacts a DUT, that heater block 420a is suitably pushed against and closely contacts the DUT, so the temperature of the DUT can be accurately measured.

Further, since each first temperature adjustment head 400a is supported with play with respect to the temperature adjustment board 300, when a first temperature adjustment head 400a contacts a DUT, variations in height or inclination of the DUT mounted on the burn-in board 200 can be absorbed by the first temperature adjustment head 400a, and the first temperature adjustment heads 400a can be made to closely contact the DUT, so this first temperature adjustment head 400a enables the temperature of the DUT to be more accurately adjusted.

Further, by having each first temperature adjustment head 400a supported on a frame 301 through third springs 305, when a first temperature adjustment head 400a contacts a DUT, it is possible to make that first temperature adjustment head 400a be suitably pushed against and closely contact the DUT, so this first temperature adjustment head 400a enables the temperature of the DUT to be more accurately adjusted.

Note that up until right before a first temperature adjustment head 400a contacts a DUT, the shoulders 424 of the heater block 420a contact the cooling block 410a due to the action of the first springs 423a. Due to this, the heater 421a of the heater block 420a can be used to raise the temperature of the coolant flowing through the channels of the cooling block 410a, so there is no longer a need to provide the chiller 900 with a heater etc. for heating the coolant.

Similarly, up until right before the first temperature adjustment head 400a contacts a DUT, the shoulders 434 of the sensor block 430a contact the cooling block 410 due to the action of the second springs 433a. Due to this, the temperature of the cooling block 410a or the operating state of the heater 421a of the heater block 420a can be monitored or the temperature sensor 431a itself can be diagnosed.

As shown in FIG. 13, when a first temperature adjustment head 400a contacts a DUT, the burn-in controller 800 monitors the temperature of the DUT by the temperature sensor 431a of the sensor block 430a and heats the heater 321a of the heater block 420a so as to apply thermal stress to the DUT and raise it to a predetermined DUT temperature. This DUT temperature is for example 125° C.

When the temperature of the DUT reaches a predetermined temperature, the burn-in controller 800 supplies that DUT with power voltage and a signal close to that of actual operation through the connector 120 of the burn-in chamber 200 and the edge connector 202 of the burn-in board 200 for screening. Due to the supply of this power voltage, the DUT generates heat by itself and so the DUT changes in temperature, so the temperature sensor 431a is used to monitor the DUT for temperature and the heater 421a is turned on/off so as to adjust the temperature of the DUT to a predetermined temperature.

When applying this thermal stress, since each heater block 420a is in a thermally floating state with respect to the cooling block 410a, heat is not directly conducted from the heater block 420a to the cooling block 410a, the heater block 420a can be used to positively raise the temperature of the individual DUT, the cooling block 410a can be used to positively cool that DUT, when simultaneously performing a burn-in test on a plurality of electronic devices, it is possible to independently and accurately control the temperature of each DUT.

Further, when applying this thermal stress, since each sensor block 430a is in a thermally floating state with respect to the cooling block 410a, heat is not directly conducted from the cooling block 410a to the sensor block 430a, the temperature of the individual DUT can be accurately measured, and the precision of temperature adjustment of the DUT is improved.

The above burn-in test is performed continuously over a long period of several hours to tens of hours. During that burn-in test, any DUT exhibiting an abnormal reaction is judged defective. For example, the serial number of that DUT can be held in the burn-in controller 800 and the test results fed back.

Next, for example, a second temperature adjustment head 400b for dealing with 100 to 200 W level high heat emitting types of DUTs will be explained.

This second temperature adjustment head 400b, as shown in FIG. 14 to FIG. 16, is provided with a cooling block 410b for cooling a DUT, a heater block 420b for heating a DUT, and a sensor block 430b for measuring a DUT for temperature. Aside from a bypass for making the coolant bypass the inside space not being formed in the cooling block, this is structured similar to the above-mentioned first temperature adjustment head 400a.

This second temperature adjustment head 400b deals with relatively large heat emitting 100 to 200 W level high heat emitting types of DUTs and is required to exhibit a higher cooling performance compared with the first temperature adjustment head 400a, so as shown in that figure is not formed with a bypass like the above-mentioned first temperature adjustment head 400a. The entire amount of the coolant supplied from the branch pipe 303 through the entrance side channel 411b and exit side channel 413b is designed to flow through the inside space 412b.

Further, this second temperature adjustment head 400b makes the thermal resistance θ cw between a DUT and the coolant 0.4° C./W and therefore lowers that thermal resistance θ cw more than the first temperature adjustment head 400b to improve the cooling efficiency. Note that as the method for reducing the thermal resistance θ cw, for example, the methods of strengthening the pushing force of the temperature adjustment head, using a material more superior in heat conductivity to make the cooling block, increasing the heat conduction area of the coolant, etc. may be illustrated.

Due to this, as shown in FIG. 12, when the coolant may vary in temperature in the range of 27° C.≦Tw≦80° C., the temperature Tc of a DUT, which may vary in amount of self generated heat in the range of 100 W to 200 W, may be adjusted by the heater 421b so as to set the DUT temperature at any temperature in the range of about 107° C. to about 160° C.

Next, for example, a third temperature adjustment head for dealing with 200 to 300 W level superhigh heat emitting types of DUTs will be explained.

This third temperature adjustment head, while not particularly illustrated, is basically the same in configuration as the second temperature adjustment head 400b. However, the third temperature adjustment head deals with 200 W to 300 W level superhigh heat emitting types of DUTs, so is required to exhibit a higher cooling performance than the second temperature adjustment head 400b.

Therefore, this third temperature adjustment head makes the thermal resistance θ cw between a DUT and the coolant 0.28° C./W and reduces that thermal resistance θ cw more than the second temperature adjustment head 400c so as to further improve the cooling performance.

Due to this, as shown in FIG. 12, when the coolant may vary in temperature in the range of 27° C.≦Tw≦80° C., the temperature Tc of the DUT, which may vary in amount of self generated heat in the range of 200 W to 300 W, may be adjusted by a heater built in the heater block to freely set the DUT temperature in the range of about 111° C. to about 164° C.

Further, in the burn-in system 1 according to the present embodiment, among the total three types of temperature adjustment heads explained above changing the cooling performance by the presence/absence of bypasses and changing the thermal resistance between the DUTs and cooling blocks, the one matching the amount of self generated heat of each DUT is selected to enable DUTs of a wide range of amounts of self generated heated of 0 W to 300 W or so to be handled by the same burn-in system.

Note that the first to third temperature adjustment heads may be mounted mixed on the same temperature adjustment board 300 or first temperature adjustment heads 400a may be mounted on one temperature adjustment board 300, second temperature adjustment heads 400b mounted on another temperature adjustment board 300, and third temperature adjustment heads mounted on another temperature adjustment board 300.

Second Embodiment

Figure 17:
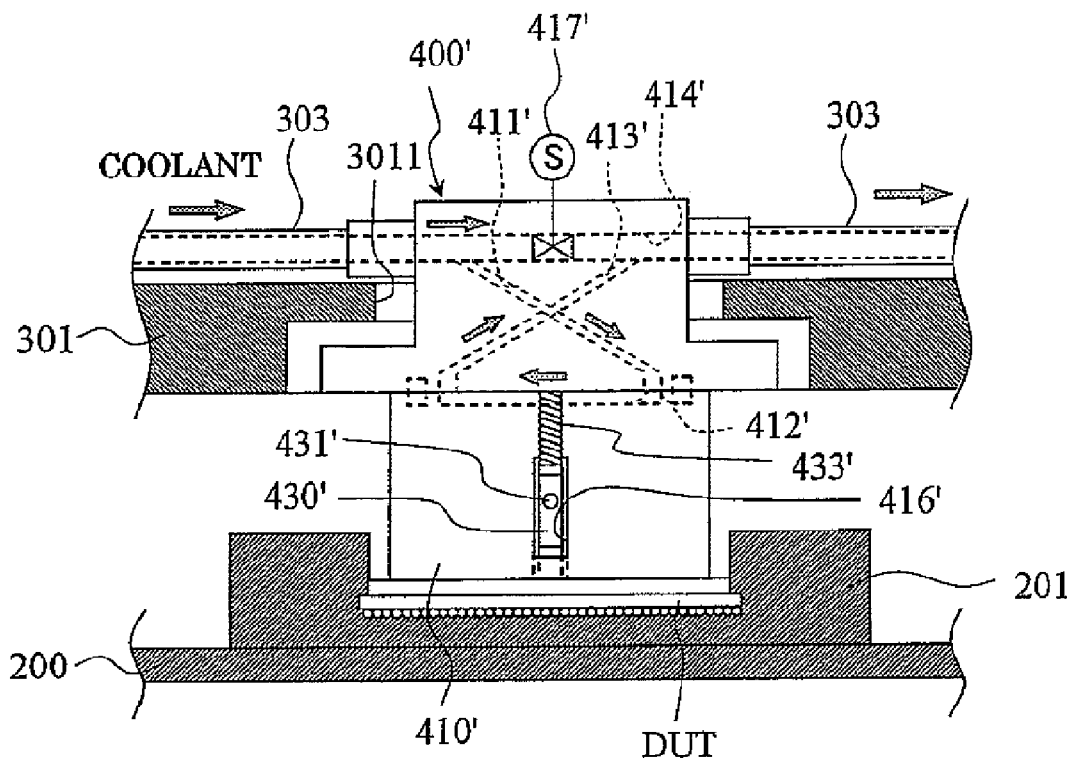
FIG. 17 is a side view of a temperature adjustment head in a second embodiment of the present invention.

FIG. 17 is a side view of a temperature adjustment head in a second embodiment of the present invention.

The burn-in system according to the second embodiment of the present invention differs in structure of the temperature adjustment head from the burn-in system 1 according to the first embodiment, but the rest of the configuration is identical to that of the burn-in system 1 according to the first embodiment. Below, the burn-in system according to the second embodiment will be explained only with reference to the points of difference from the burn-in system 1 according to the first embodiment.

The temperature adjustment head 400' in the present embodiment, as shown in FIG. 17, is not provided with any heater block. Instead, a bypass 414' of the cooling block 410' is provided with a valve 417' (variable flow rate means). The head differs from the first temperature adjustment head 400a in the first embodiment on this point, but otherwise is the same in configuration.

In the first temperature adjustment head 400a in the first embodiment, the heater 421a of each heater block 420a was used to adjust a DUT in temperature, but in the temperature adjustment head 400' in this embodiment, instead of a heater, the valve 417' is operated to adjust the flow rate of the coolant flow through the inside space 412a through the channels 411a and 413a to thereby adjust the DUT in temperature.

The valve 417' provided at this temperature adjustment head 400', while not particularly illustrated, is connected to the burn-in controller to enable control. Based on on/off signals of that burn-in controller, the valve 417' is operated to adjust the flow rate of coolant flowing through the bypass 414'. Note that this valve 417' may also be provided not at the bypass 414', but at the entrance side channel 411' or exit side channel 413'.

As explained above, in the burn-in system according to the second embodiment of the present invention, instead of the heater, a valve 417' is provided at the entrance side channel 411' formed in the cooling block 410' of each temperature adjustment head 400'. This valve 417' is used to change the flow rate of the coolant so as to adjust the cooling thermal resistance in the cooling block 410'. Due to this, the individual DUTs can be easily adjusted in temperature, so when simultaneously performing a burn-in test on a plurality of electronic devices, it is possible to independently and accurately control the temperatures of the individual DUTs.

Third Embodiment

Figure 18:
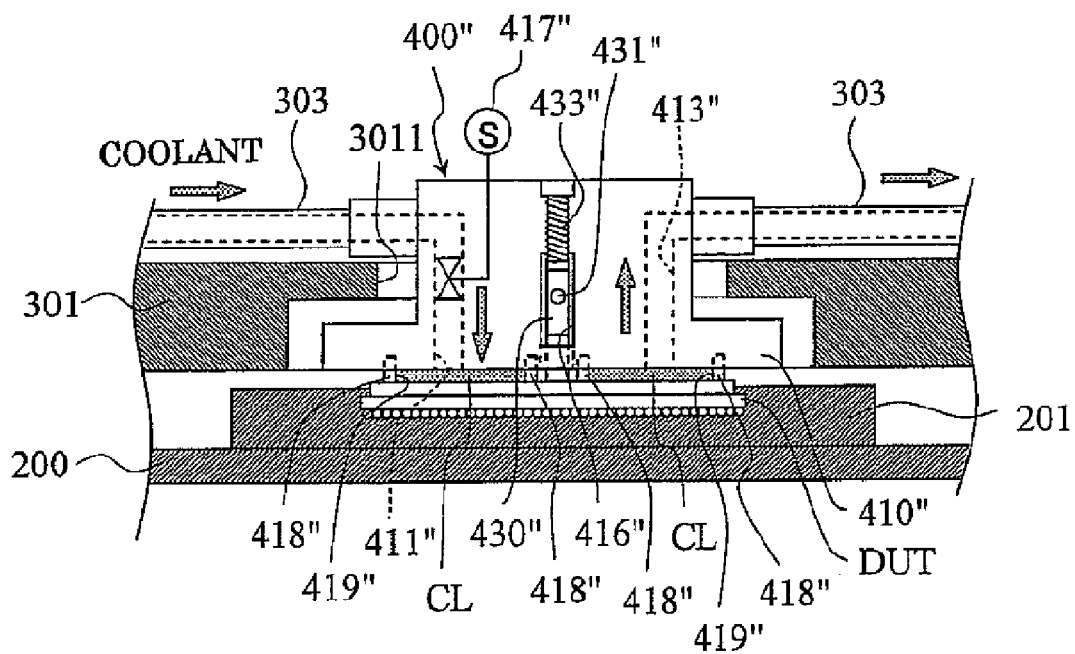
FIG. 18 is a side view of a temperature adjustment head in a third embodiment of the present invention.
Figure 19:
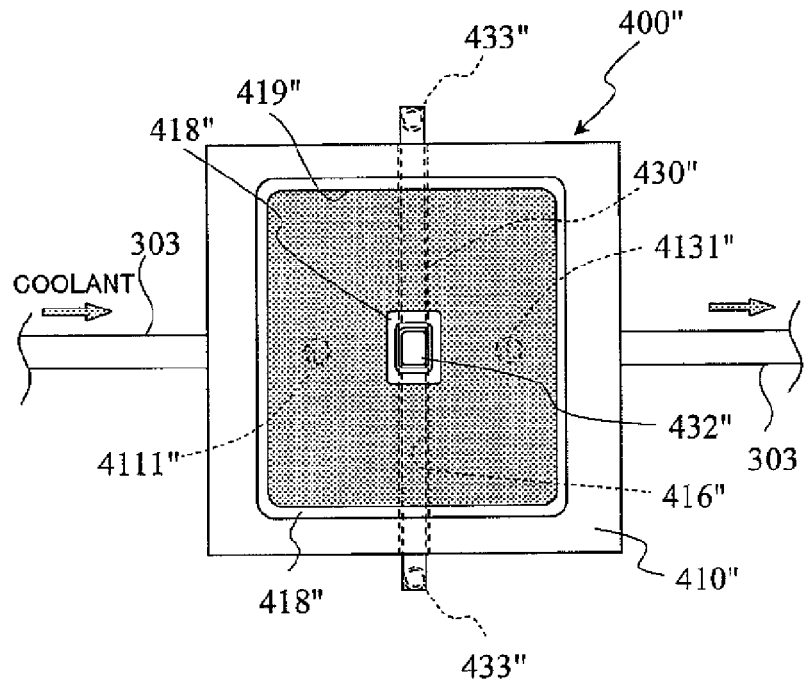
FIG. 19 is a bottom plan view of the temperature adjustment head shown in FIG. 18.
Figure 20:
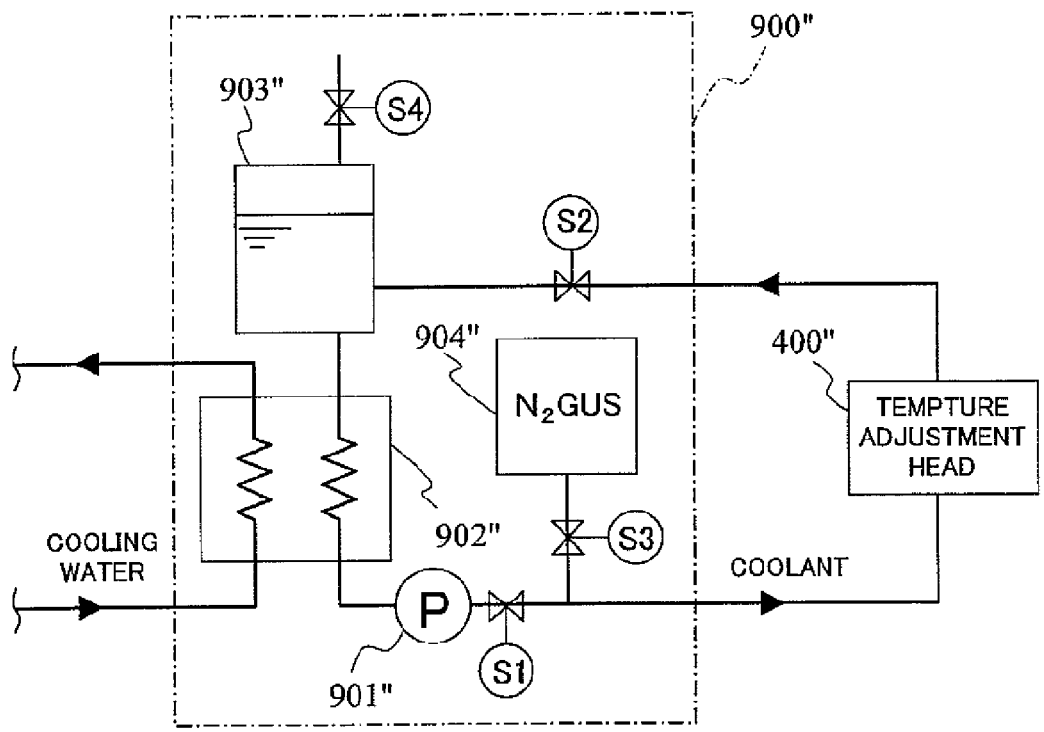
FIG. 20 is a schematic view of a coolant recovering means of a burn-in system according to a third embodiment of the present invention.

FIG. 18 is a side view of a temperature adjustment head in a third embodiment of the present invention, FIG. 19 is a bottom plan view of the temperature adjustment head shown in FIG. 18, and FIG. 20 is a schematic view of a coolant recovering means of a burn-in system according to a third embodiment of the present invention.

In the burn-in systems according to the first and second embodiments explained above, the DUTs were indirectly cooled by coolant through the cooling blocks so as to adjust the DUTs in temperature, but in the burn-in system according to the third embodiment of the present invention, the coolant is made to directly contact the DUTs to adjust the DUTs in temperature.

Therefore, the burn-in system according to the third embodiment of the present invention differs in the structure of the temperature adjustment heads. Further, it differs from the burn-in system 1 according to the first embodiment in the point of being provided with coolant recovering means for recovering the coolant after the burn-in test, but rest of the configuration is identical to that of the burn-in system 1 according to first embodiment. Below, the burn-in system according to the third embodiment will be explained with reference to only the points of difference from the burn-in system 1 according to the first embodiment.

First, explaining the temperature adjustment head 400" according to this embodiment, this temperature adjustment head 400", as shown in FIG. 18 and FIG. 19, is similar to the second temperature adjustment head 400b according to the first embodiment (see FIG. 14 to FIG. 16), but differs from the second temperature adjustment head 400b according to the first embodiment in the point that the cooling block 410" of this temperature adjustment head 400" does not have any part corresponding to the bottom half of the cooling block 410b of that second temperature adjustment head 400b and in the point that instead of a heater block, a valve 417" (variable flow rate means) is provided.

More specifically, the cooling block 410" of each temperature adjustment head 400" according to this embodiment is shaped as the cooling block 410b of the second temperature adjustment head 400b cut off so that its inside space 412b is open. Due to this, the entrance side channel 411" communicating with the branch pipe 303 opens at the entrance side opening 4111" formed at the bottom end face of the cooling block 410". Similarly, the exit side channel 413" communicating with the branch pipe 303 opens at an exit side opening 413" formed at the bottom end face of the cooling block 410".

Further, the cooling block 410" of this temperature adjustment head 400" is formed with a second holding space 416". A sensor block 430" with a built-in temperature sensor 431" is accommodated in that accommodating space 416" in a state maintaining a clearance. Note that the temperature adjustment head 400" according to this embodiment, like the temperature adjustment head 400' according to the second embodiment, is not provided with any heater block with a built-in heater.

Further, the bottom end face of this cooling block 410" is fit with ring shaped packings 481" at its outer periphery and at the periphery of the accommodating space 416" in which the sensor block 430" is accommodated.

Therefore, when the temperature adjustment head 400" according to the present embodiment contacts a DUT, as shown in FIG. 18, the bottom end face of that temperature adjustment head 400", the packings 418", and the top face of the DUT define a space 419". Coolant CL supplied through the entrance side opening 4111" of the entrance side channel 411" enters this space 419', so that coolant can directly contact the DUT.

Further, the temperature adjustment head 400" according to the present embodiment has a valve 417" for adjusting the flow rate of the coolant. That valve 417" is provided inside the entrance side channel 411" formed at the cooling block 410". Note that the mounting position of this valve 417" is not particularly limited in the present invention. For example, the valve may also be provided at the exit side channel.

The valve 417" provided at this temperature adjustment head 400", while not particularly limited, is connected to the burn-in controller for control. Based on on/off control of that burn-in controller, the valve 417" is operated to adjust the flow rate of the coolant flowing through the entrance side channel 411".

Next, explaining the coolant recovering means according to the burn-in system according to the present embodiment, as shown in FIG. 20, the coolant recovering means in this embodiment is provided at the chiller 900". This chiller 900" is provided with a pump 901 for circulating the coolant, a heat exchanger 902 for transferring the heat of the coolant to for example about 20° C. or less cooling water so as to cool the coolant, a tank 903 for holding the recovered coolant, and a compressed gas supply apparatus 904 for recovering the coolant and can form a circulation route from the pump 901 through a temperature adjustment head 400" (more specifically, the channels 411" and 413"), tank 903, and heat exchanger 902 and back to the pump 901.

This circulation route is provided with two valves S1 and S2. The first valve S1 is provided between the pump 901 and the temperature adjustment head 400", while the second valve S2 is provided between the temperature adjustment head 400" and the tank 903.

Further, this circulation route is connected through a third valve S3 to the compressed gas supply apparatus 904. This compressed gas supply apparatus 904 supplies compressed gas to the circulation route to forcibly recover coolant directly contacting the DUTs in the tank 903 after the burn-in test. As the gas supplied from this compressed gas supply apparatus 904, for example, nitrogen gas may be mentioned. Further, along with the employment of recovery using this compressed gas, the pressure of the compressed gas is released into the atmosphere after the coolant is recovered, so the tank 903 is provided with a fourth valve S4. Note that the first to fourth valves S1 to 54 are all, while not particularly shown, connected to the burn-in controller for control. Based on on/off control of that burn-in controller, the valves S1 to S4 are operated.

Next, the method of recovery of the coolant recovering means provided at this chiller 900" will be explained.

First, when adjusting the temperatures of the DUTs in the burn-in test, the first and second valves S1 and S2 are opened, the third and fourth valves S3 and S4 are closed, and a circulation route is formed. Therefore, in this state, the action of the pump 901 causes the coolant to circulate through the circulation route. The coolant cooled at the heat exchanger 902 is supplied to the temperature adjustment head 400", then the used coolant passes through the tank 903 and is cooled again at the heat exchanger 902.

Next, when the burn-in test ends, the pump 901 is stopped and the second to fourth valves S2 to S4 are opened. Therefore, in this state, the circulation route is blocked at the first valve S1. Instead, the opening of the second to fourth valves S2 to S4 causes the formation of a recovery route from the compressed gas supply apparatus 904 through the temperature adjustment head 400" to the tank 903. Further, when supplied from the compressed gas supply apparatus 904 to that recovery route, the coolant accumulated in the temperature adjustment head 400" is pushed out by the compressed gas and recovered at the tank 903. After the coolant finishes being recovered, all of the valves S1 to S4 are closed.

As explained above, in the burn-in system according to the third embodiment of the present invention, when pushing the cooling block 410" of the temperature adjustment block 400" against a DUT, the coolant supplied through the entrance side opening 4111" of the entrance side channel 4111" is made to directly contact the surface of the DUT and the valve 417" is controlled to operate to enable the individual DUT to be directly adjusted in temperature. When simultaneously performing a burn-in test on a plurality of DUTs, it is possible to independently and accurately control the temperature of each DUT.

Further, by providing the chiller 900" with the above-mentioned recovering means, it is possible to recover the coolant directly contacting the DUTs after the end of the burn-in tests.

Note that the embodiments explained above were given for facilitating understanding of the present invention and were not given for limiting the present invention. Therefore, the elements disclosed in the embodiments include all design changes or equivalents falling under the technical scope of the present invention.

In the above embodiments, the burn-in system was explained as a monitored burn-in system, but the present invention is not particularly limited to this. For example, it may also be a dynamic burn-in system which applies power voltage to DUTs under a constant temperature and supplies signals close to actual operation to the input circuits of the DUTs for screening or a static burn-in system which applies power voltage to DUTs under a high temperature and sends a current through the DUTs to apply temperature and voltage stress to the DUTs for screening. General burn-in systems are included.

The invention claimed is:

1. A burn-in system for conducting a burn-in test on a plurality of devices under test mounted on a burn-in board, comprising:
    heating blocks having heating device configured to heat the devices; and
    cooling blocks formed with channels able to carry a coolant for cooling the devices under test, wherein
    each of the cooling blocks is formed with a first accommodating space for accommodating one heating block,
    each of the heating blocks is accommodated in corresponding the first accommodating space with a layer of air formed between the heating block and the cooling block so as to be insulated from the cooling block,
    the each heating block is supported and mechanically floating with respect to the cooling block,
    a front end face of the heating block and a front end face of the cooling block are able to come in directly contact with the device under test, and
    when the heating block is not in contact with a device under test, the front end face of the heating block sticks out relative to the front end face of the cooling block.

2. A burn-in system as set forth in claim 1, further comprising first biasing devices configured to bias the heating blocks to the front end face, wherein the each heating block and the each cooling block are provided between them with the first biasing device.

3. A burn-in system as set forth in claim 2, wherein when the heating block is not in contact with the device under test,
    the first biasing devices cause the heating block to be biased to and cause part of the heating block to contact the cooling block.

4. A burn-in system as set forth in claim 1, further comprising measurement blocks having measuring device configured to measure temperatures of the devices under test, wherein
    each of the cooling blocks is formed with a second accommodating space for accommodating the measurement block, and
    each of the measurement blocks is accommodated in corresponding the second accommodating space having a layer of air formed between the measurement block and the cooling block so as to be insulated from the cooling block.

5. A burn-in system as set forth in claim 4, wherein
    the each measurement block is supported and mechanically floating with respect to the cooling block, and
    in the state where the measurement block is not in contact with the device under test,
    the front end face of the measurement block sticks out relative to the front end face of the cooling block.

6. A burn-in system as set forth in claim 5, further comprising second biasing devices configured to bias the measurement block to the front end face, wherein the each measurement block and the each cooling block are provided between them with the each second biasing device.

7. A burn-in system as set forth in claim 6, wherein
in a state where the measurement block is not in contact with the device under test,
the second biasing devices cause the measurement block to be biased to the front end face and cause part of the measurement block to contact the cooling block.

8. A burn-in system as set forth in claim 1, further comprising:
temperature adjustment boards supporting a plurality of the cooling blocks at a frame with mechanical floating; and
a burn-in chamber able to hold each burn-in board and having the temperature adjustment boards, wherein
the each temperature adjustment board is provided in the burn-in chamber so that the each cooling block faces a device under test mounted on the burn-in board.

9. A burn-in system as set forth in claim 8, further comprising third biasing devices configured to bias the cooling block toward a burn-in board facing the cooling block in the burn-in chamber, wherein the each cooling block is supported on a frame through the each third biasing device.

10. A burn-in system as set forth in claim 8, wherein at least part of the channels formed at the plurality of cooling blocks are connected in series.

11. A burn-in system as set forth in claim 10, wherein the each cooling block is provided with a bypass for making the coolant bypass the channels.

12. A burn-in system as set forth in claim 11, wherein the temperature adjustment boards have first cooling blocks formed with the bypasses and second cooling blocks not formed with the bypasses.

13. A burn-in system as set forth in claim 11, wherein
the burn-in chamber has a plurality of the temperature adjustment boards,
one temperature adjustment board among the plurality of temperature adjustment boards has first cooling blocks formed with the bypasses and the other temperature adjustment boards have second cooling blocks not formed with the bypasses.

14. A burn-in system as set forth in claim 8, wherein the each temperature adjustment board has at least two types of cooling blocks having different thermal resistances between the coolant and the devices under test.

15. A burn-in system as set forth in claim 8, wherein
the burn-in chamber has a plurality of the temperature adjustment boards, and
a thermal resistance between the coolant and the devices under test in coolant blocks in one temperature adjustment board among the plurality of temperature adjustment boards and a thermal resistance between the coolant and the devices under test in coolant blocks of the other temperature adjustment boards are different.

16. A temperature adjustment head comprising:
a heating block having heating device configured to heat a device under test; and
a cooling block formed with channels able to carry a coolant for cooling the device under test, wherein
the cooling block is formed with a first accommodating space for accommodating the heating block,
the heating block is accommodated in the first accommodating space having a layer of air formed between the heating block and the cooling block so that it is insulated from the cooling block,
the heating block is supported and mechanically floating with respect to the cooling block,
a front end face of the heating block and a front end face of the cooling block are able to come in directly contact with the device under test, and
when the heating block is not in contact with a device under test, the front end face of the heating block sticks out relative to the front end face of the cooling block.

17. A temperature adjustment head as set forth in claim 16, further comprising a measurement block having a measuring device configured to measure a temperature of the device under test, wherein
the cooling block is formed with a second accommodating space for accommodating the measurement block, and
the measurement block is accommodated in the second accommodating space having a layer of air formed between the measurement block and the cooling block so as to be insulated from the cooling block.

* * * * *